United States Patent
Yamano

(10) Patent No.: US 7,919,843 B2
(45) Date of Patent: Apr. 5, 2011

(54) SEMICONDUCTOR DEVICE AND ITS MANUFACTURING METHOD

(75) Inventor: Takaharu Yamano, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 12/489,577

(22) Filed: Jun. 23, 2009

(65) Prior Publication Data
US 2009/0321896 A1 Dec. 31, 2009

(30) Foreign Application Priority Data
Jun. 25, 2008 (JP) .................................. 2008-165426

(51) Int. Cl.
*H01L 23/02* (2006.01)
(52) U.S. Cl. .................. 257/678; 257/781; 257/E23.114
(58) Field of Classification Search ................... 257/659, 257/700, 678, 779–781, 784, E23.114, 772
See application file for complete search history.

(56) References Cited

U.S. PATENT DOCUMENTS
6,355,500 B2 * 3/2002 Miyazaki et al. ............. 438/106

FOREIGN PATENT DOCUMENTS
JP 2008-084958 4/2008
* cited by examiner

*Primary Examiner* — Davienne Monbleau
*Assistant Examiner* — Hoa B Trinh
(74) *Attorney, Agent, or Firm* — Drinker Biddle & Reath LLP

(57) ABSTRACT

There is provided a semiconductor device 10 including a solder resist 16 for protecting a wiring pattern 14 electrically connected to a semiconductor chip 11 via an internal connection terminal 12, characterized in that the solder resist 16 is arranged to cover the upper surface of the portion of the wiring pattern 14 not corresponding to the arrangement region of the external connection terminal 17 and the side surface 14B of the wiring pattern 14 and that the area of the solder resist 16 assumed when the upper surface 13A of an insulation layer 13 is viewed from above is substantially the same as that of the wiring pattern 14 assumed when the upper surface 13A of the insulation layer 13 is viewed from above.

4 Claims, 27 Drawing Sheets

SEMICONDUCTOR DEVICE AND ITS MANUFACTURING METHOD

BACKGROUND OF THE INVENTION

The present invention relates to a semiconductor device and its manufacturing method and in particular to a semiconductor device having substantially the same size as a semiconductor chip when viewed from above and where the semiconductor chip and a wiring pattern are electrically connected to each other and its manufacturing method.

In recent years, semiconductor application products have been rapidly downsized, thinned and reduced in weight for applications in a variety of mobile devices such as digital cameras and cell phones. With this trend, semiconductor devices such as NAND-type flash memories have been requested to shrink and to support higher packing density. A semiconductor device (refer to FIG. 1) has been proposed that is called CSP (Chip Size Package) having substantially the same size as a semiconductor chip viewed from above.

FIG. 1 is a cross-sectional view of a related art semiconductor device.

As shown in FIG. 1, a related art semiconductor device 100 includes a semiconductor chip 101, an internal connection terminal 102, a resin layer 103, a wiring pattern 104, a solder resist 106, and an external connection terminal 107.

The semiconductor chip 101 includes a semiconductor substrate 110 reduced in thickness, a semiconductor integrated circuit 111, a plurality of electrode pads 112, and a protective film 113. The semiconductor integrated circuit 111 is arranged on the front surface of the semiconductor substrate 110. The semiconductor integrated circuit 111 includes a diffusion layer, an insulation layer, vias, wiring and the like. The plurality of electrode pads 112 are arranged on the semiconductor integrated circuit 111. The plurality of electrode pads 112 are electrically connected to the wiring arranged on the semiconductor integrated circuit 111. The protective film 113 is arranged on semiconductor integrated circuit 111. The protective film 113 is a film used to protect the semiconductor integrated circuit 111.

The internal connection terminal 102 is arranged on the electrode pad 112. The upper surface 102A of the internal connection terminal 102 is exposed from the resin layer. An upper surface of the internal connection terminal 102 is connected to the wiring pattern 104. The resin layer 103 is arranged to cover the side of the semiconductor substrate 101 where the internal connection terminal 102 is arranged.

The wiring pattern 104 is arranged on the resin layer 103. The wiring pattern 104 is connected to the internal connection terminal 102. The wiring pattern 104 is electrically connected to the electrode pads 112 via the internal connection terminal 102. The wiring pattern 104 has an external connection terminal arrangement region 104A where the external connection terminal 107 is arranged. The solder resist 106 is arranged on the upper surface 103A of the resin layer 103 to cover the portion of the wiring pattern 104 except the external connection terminal arrangement region 104A.

FIGS. 2 to 10 show the manufacturing process of a related art semiconductor device. In FIGS. 2 to 10, the same sign is given to the same component as that of the related art semiconductor device 100.

The method for manufacturing the related art semiconductor device 100 will be described referring to FIGS. 2 to 10. In the process shown in FIG. 2, the semiconductor chip 101 including the semiconductor integrated circuit 111, the plurality of electrode pads 112 and the protective film 113 is formed on the front surface of the semiconductor substrate 110 before being reduced in thickness. Next, in the process shown in FIG. 3, the internal connected terminals 102 are formed on the plurality of electrode pads 112. In this stage, there are variations in height between the plurality of internal connected terminals 102.

Next, in the process shown in FIG. 4, the resin layer 103 in a semi-cured state is formed to cover the plurality of internal connection terminals 102 and the upper surface 113A of the protective film 113. In the process shown in FIG. 5, a metallic layer 115 is formed to cover the upper surface 103A of the resin layer 103. The metallic layer 115 is a layer that serves as the matrix of the wiring pattern 104.

Next, in the process shown in FIG. 6, the metallic layer 115 and the plurality of internal connection terminals 102 are press-fitted to each other and the resin layer 103 in the semi-cured state is cured by pressing the metallic layer 115 with a structure shown in FIG. 5 heated. It is thus possible to electrically connect the metallic layer 115 and the plurality of internal connection terminals 102 even in the presence of variations in height between the plurality of internal connection terminals 102.

Next, in the process shown in FIG. 7, the metallic layer 115 shown in FIG. 6 is patterned to form the wiring pattern 104. Next, in the process shown in FIG. 8, the solder resist 106 is formed to cover the portion of the wiring pattern 104 except the external connection terminal arrangement region 104A and the upper surface 103A of the resin layer 103. The solder resist 106 is used to protect the wiring pattern 104.

Next, in the process shown in FIG. 9, the semiconductor substrate 110 is polished from the rear side of the semiconductor substrate 110 to thin the semiconductor substrate 110. Next, in the process shown in FIG. 10, the external connection terminal 107 is formed in the external connection terminal arrangement region 104A. The semiconductor device 100 is manufactured from these processes (for example, refer to Patent Reference 1).

[Patent Reference 1] JP-A-2008-84958

FIG. 11 is a plan view of a related art semiconductor device. In FIG. 11, the same sign is given to the same component as that of the related art semiconductor device 100. In FIG. 11, the external connection terminal 107 is not shown for simplicity.

In the related art semiconductor device 100, the solder resist 106 is arranged only on a main surface of the semiconductor device 100 to cover the entire upper surface 103A of the portion of the insulation layer 103 not corresponding to the forming region of the wiring pattern 104. This results in warpage of the semiconductor device 100.

Another problem is that difference in the thermal expansion coefficient between the solder resist 106 and the semiconductor substrate 110 leads to warpage of the semiconductor device 100.

SUMMARY OF THE INVENTION

The invention has been accomplished in view of the aforementioned problems. An object of the invention is to provide a semiconductor device capable of reducing warpage caused by a solder resist and its manufacturing method.

According to a first aspect of the invention, there is provided a semiconductor device including:

a semiconductor substrate;

an electrode pad;

a semiconductor chip formed on the semiconductor substrate;

an internal connection terminal arranged on the electrode pad and having a flat upper surface;

an insulation layer formed on the surface of the semiconductor chip where the electrode pad is formed so as to expose the flat surface of the internal connection terminal;

a wiring pattern formed on the upper surface of the insulation layer and the upper surface of the internal connection terminal, the wiring pattern electrically connected to the internal connection terminal;

an external connection terminal arranged on the upper surface of the wiring pattern; and a solder resist for protecting the wiring pattern, wherein the solder resist is arranged to cover the upper surface of the portion of the wiring pattern not corresponding to the arrangement region of the external connection terminal and the side surface of the wiring pattern, and the area of the solder resist assumed when the upper surface of the insulation layer is viewed from above is substantially the same as the area of the wiring pattern assumed when the upper surface of the insulation layer is viewed from above.

According to a second aspect of the invention, there is provided the semiconductor device according to the first aspect, wherein the solder resist completely covers the wiring pattern.

According to a third aspect of the invention, there is provided the semiconductor device according to the first or second aspect, wherein the insulation layer includes a material that shields α rays.

According to a forth aspect of the invention, there is provided the semiconductor device according to any one of the first to third aspects, wherein the insulation layer includes a material that shields visible rays and ultraviolet rays.

With the invention, a solder resist is arranged to cover the upper surface of the portion of the wiring pattern not corresponding to the arrangement region of the external connection terminal and the side surface of the wiring pattern and the area of the solder resist assumed when the upper surface of the insulation layer is viewed from above is substantially the same as that of the wiring pattern assumed when the upper surface of the insulation layer is viewed from above. This makes it possible to reduce the area of the forming region of the solder resist formed on one surface of the semiconductor device to the minimum necessary size, thereby reducing warpage of the semiconductor device caused by a solder resist.

According to a fifth aspect of the invention, there is provided a method for manufacturing a semiconductor device including: a semiconductor substrate; an electrode pad; a semiconductor chip formed on the semiconductor substrate; an internal connection terminal arranged on the electrode pad and having a flat upper surface; an insulation layer formed on the surface of the semiconductor chip where the electrode pad is formed so as to expose the flat surface of the internal connection terminal; a wiring pattern formed on the upper surface of the insulation layer and the upper surface of the internal connection terminal, the wiring pattern electrically connected to the internal connection terminal; and an external connection terminal arranged on the upper surface of the wiring pattern;

the method comprising:

a step of preparing the semiconductor device; and a step of forming a solder resist on the upper surface of the portion of the wiring pattern not corresponding to the arrangement region of the external connection terminal and the side surface of the wiring pattern, wherein the area of the solder resist assumed when the upper surface of the insulation layer is viewed from above will be substantially the same as the area of the wiring pattern assumed when the upper surface of the insulation layer is viewed from above.

According to a sixth aspect of the invention, there is provided the method for manufacturing a semiconductor device according to the fifth aspect, further including:

a roughening step of roughening the surface of the wiring pattern before forming the solder resist.

According to a seventh aspect of the invention, there is provided the method for manufacturing a semiconductor device according to the fifth or sixth aspect, further including:

a chip forming step of forming the plurality of semiconductor chips on a base material as a matrix of the semiconductor substrate;

an external connection terminal forming step of forming the external connection terminal on the upper surface of the portion of the wiring pattern corresponding to the arrangement region of the external connection terminal after the solder resist forming step; and a chip singulating step of cutting the base material and singulating the plurality of semiconductor chips.

With the invention, a solder resist forming step is provided for forming a solder resist on the upper surface of the portion of the wiring pattern not corresponding to the arrangement region of the external connection terminal and the side surface of the wiring pattern and the solder resist forming step is provided to form the solder resist so that the area of the solder resist assumed when the upper surface of the insulation layer is viewed from above will be substantially the same as that of the wiring pattern assumed when the upper surface of the insulation layer is viewed from above. This makes it possible to reduce the area of the forming region of the solder resist formed on one surface of the semiconductor device to the minimum necessary size, thereby reducing warpage of the semiconductor device caused by a solder resist.

With the invention, it is possible to reduce warpage caused by a solder resist.

DETAILED DESCRIPTION OF THE PREFERRED EMBODIMENTS

An embodiment of the invention will be described referring to figures.

Embodiment

Figure 1:
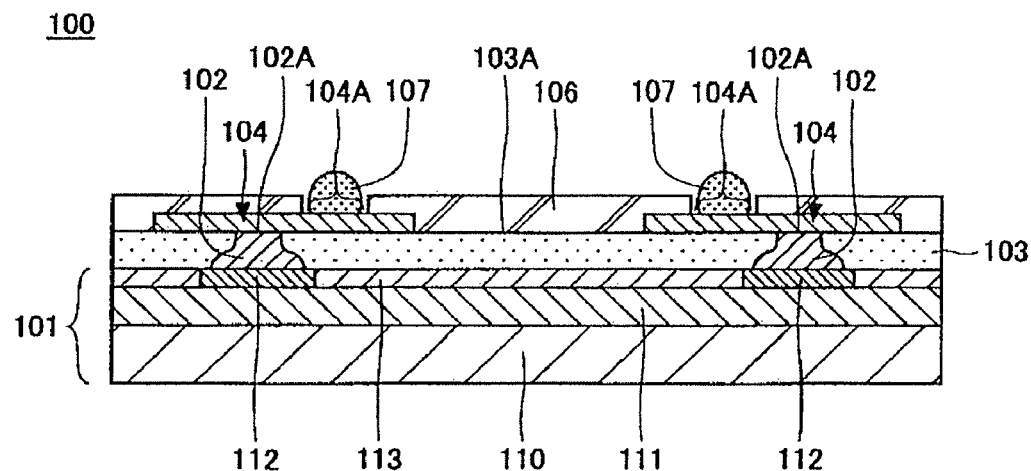
FIG. 1 is a cross-sectional view of a related art semiconductor device.
Figure 2:
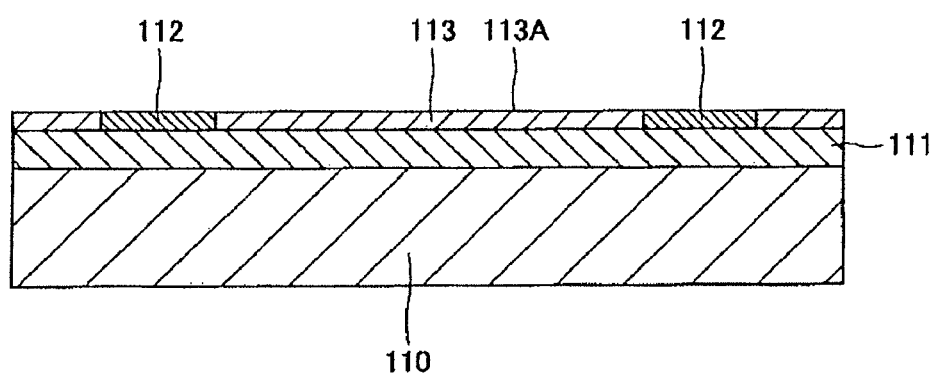
FIG. 2 shows the manufacturing processes of a related art semiconductor device (1 of 9).
Figure 3:
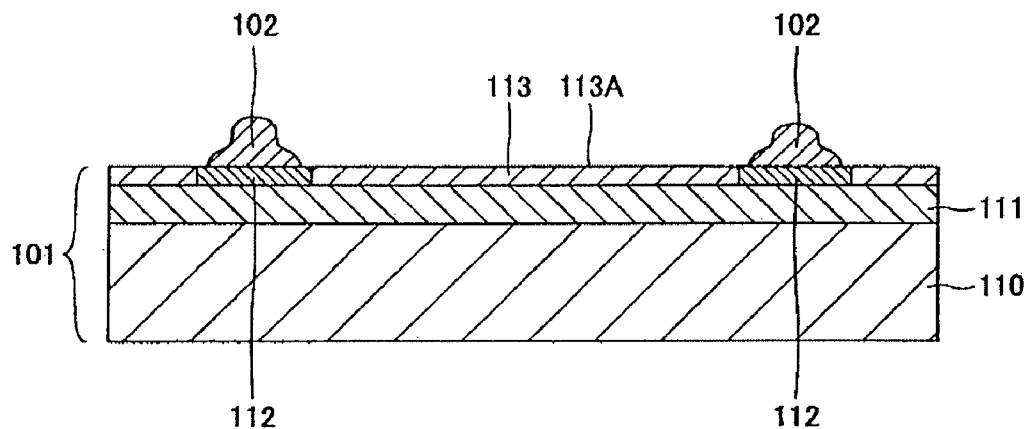
FIG. 3 shows the manufacturing processes of a related art semiconductor device (2 of 9).
Figure 4:
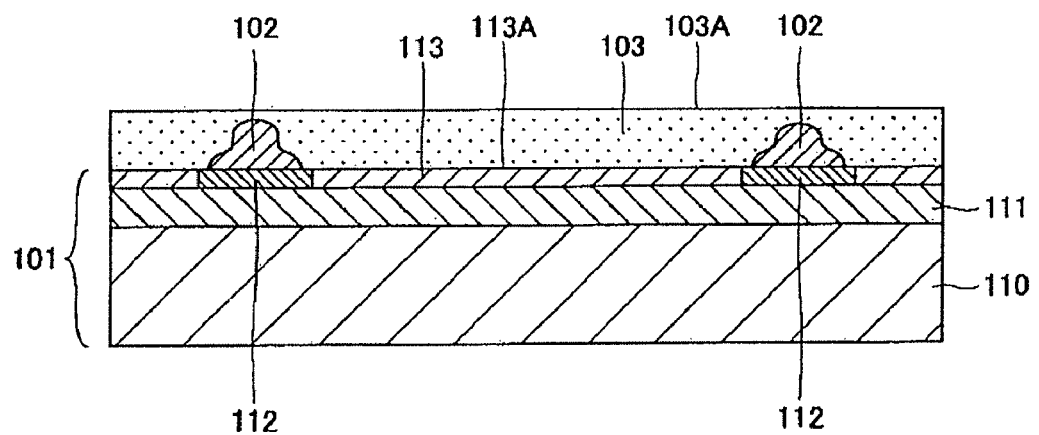
FIG. 4 shows the manufacturing processes of a related art semiconductor device (3 of 9).
Figure 5:
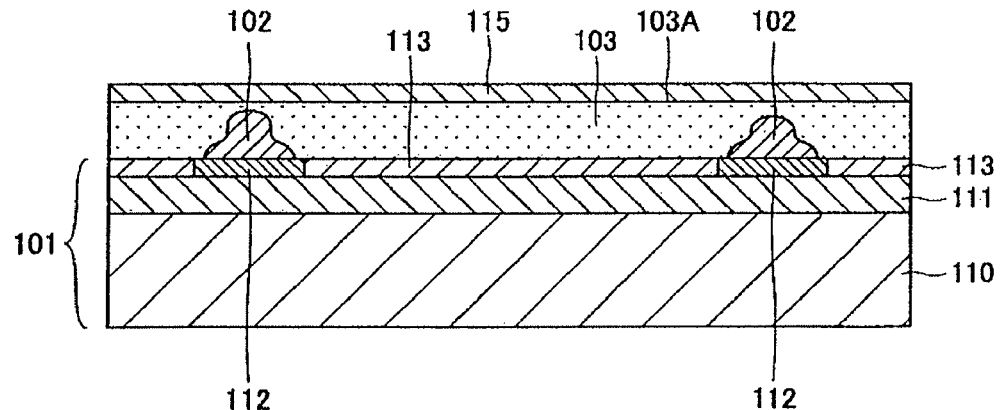
FIG. 5 shows the manufacturing processes of a related art semiconductor device (4 of 9).
Figure 6:
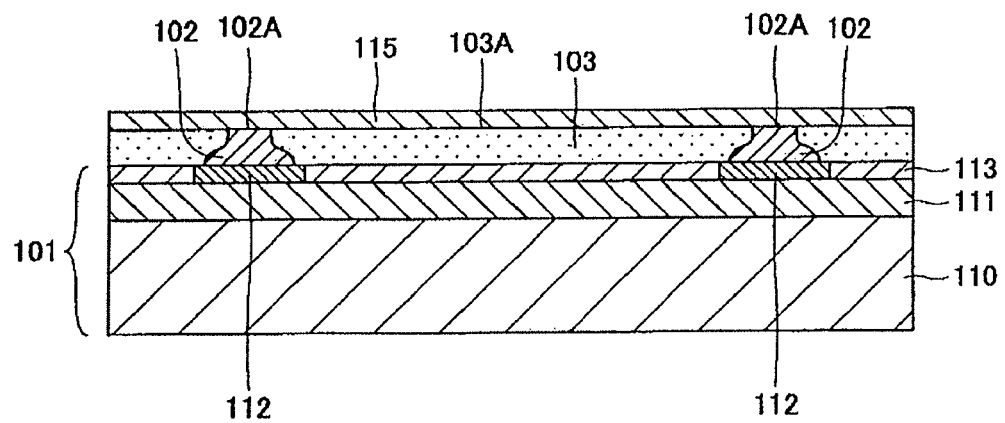
FIG. 6 shows the manufacturing processes of a related art semiconductor device (5 of 9).
Figure 7:
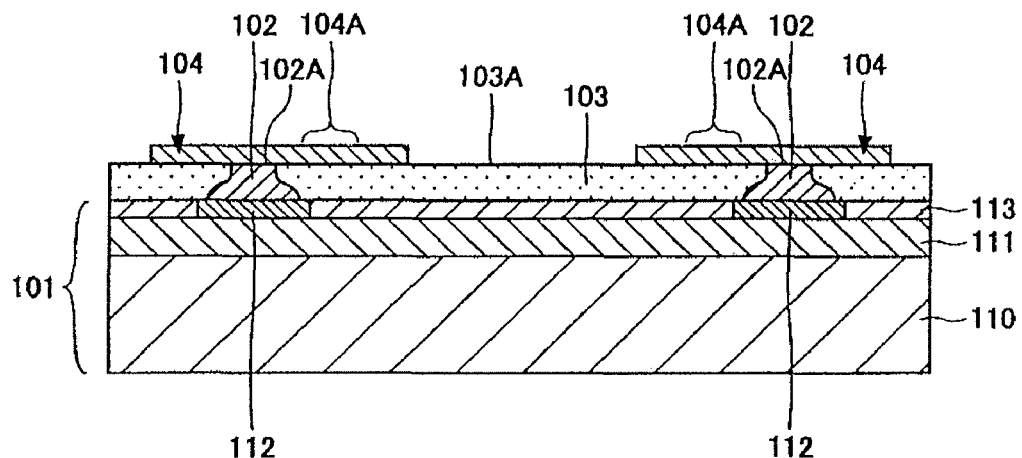
FIG. 7 shows the manufacturing processes of a related art semiconductor device (6 of 9).
Figure 8:
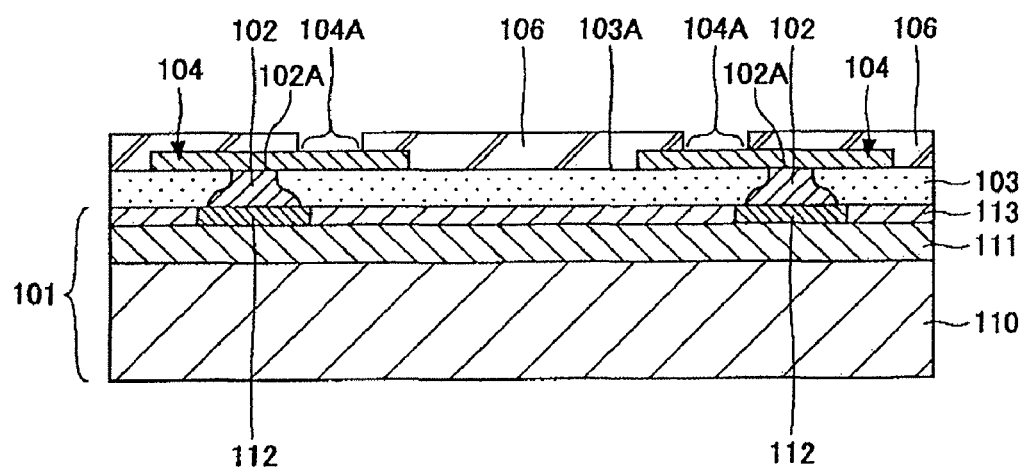
FIG. 8 shows the manufacturing processes of a related art semiconductor device (7 of 9).
Figure 9:
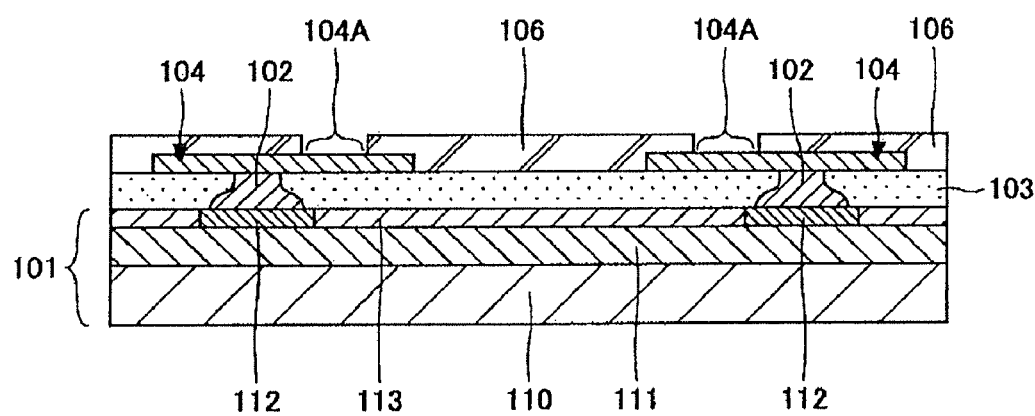
FIG. 9 shows the manufacturing processes of a related art semiconductor device (8 of 9).
Figure 10:
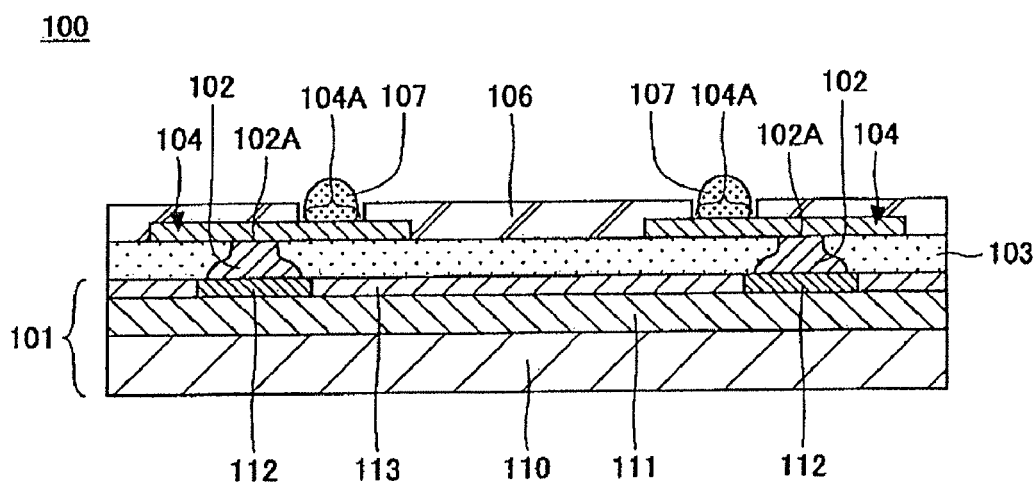
FIG. 10 shows the manufacturing processes of a related art semiconductor device (9 of 9).
Figure 11:
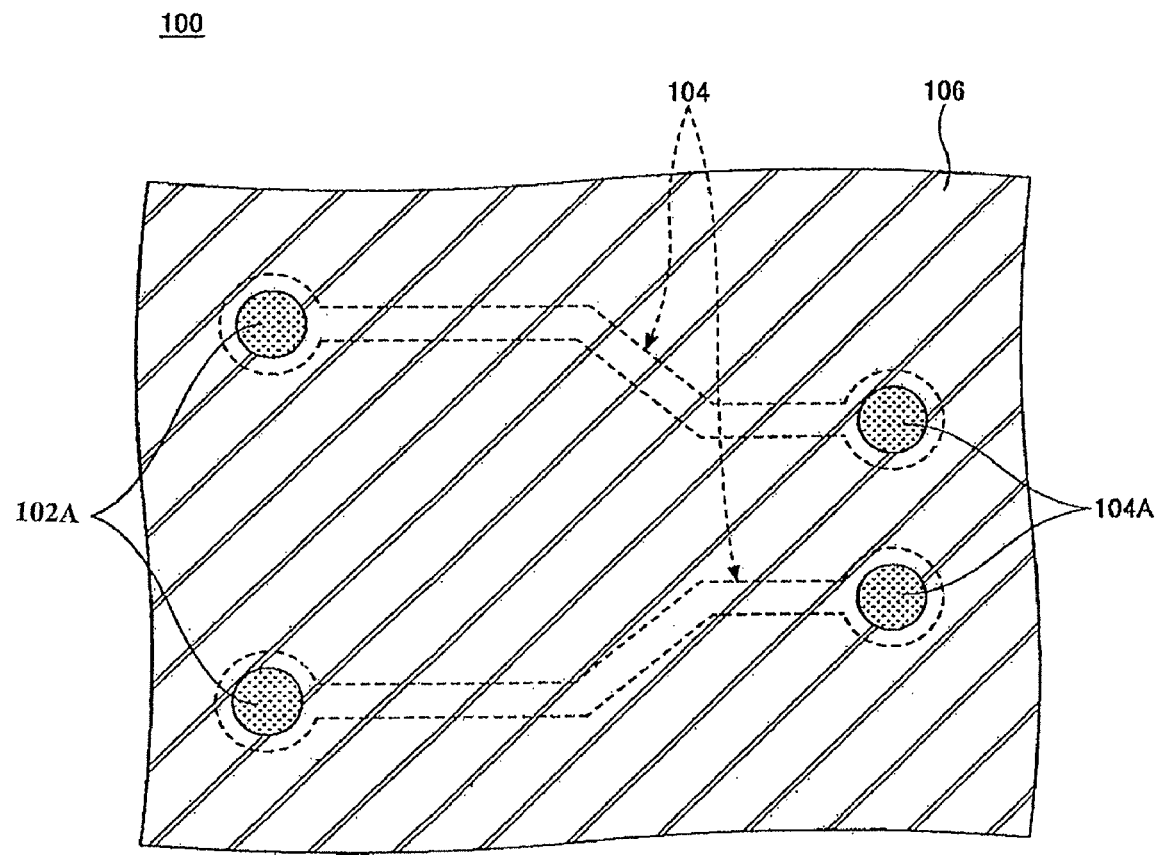
FIG. 11 is a plan view of a related art semiconductor device.
Figure 12:
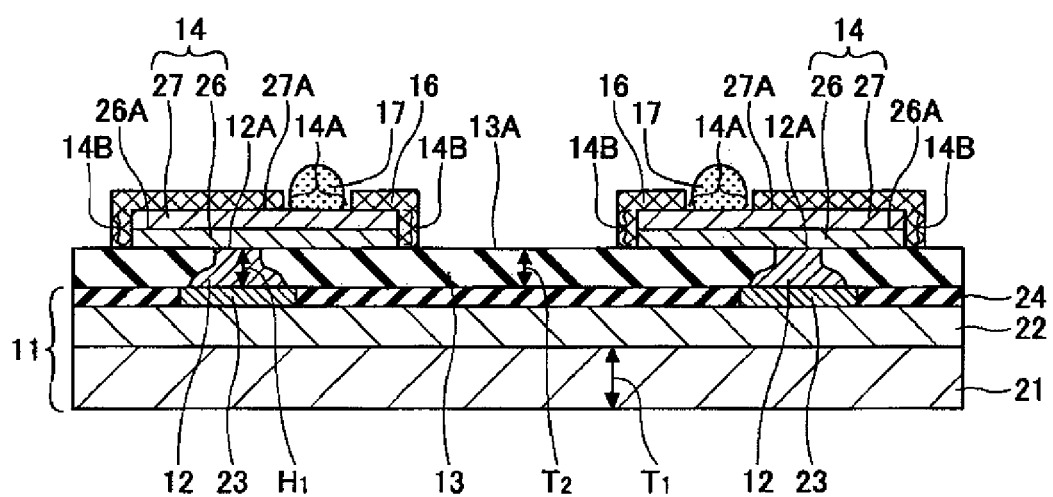
FIG. 12 is a cross-sectional view of a semiconductor device according to an embodiment of the invention.

FIG. 12 is a cross-sectional view of a semiconductor device according to an embodiment of the invention.

As shown in FIG. 12, a semiconductor device 10 of this embodiment includes a semiconductor chip 11, an internal connection terminal 12, an insulation layer 13, a wiring pattern 14, a solder resist 16, and an external connection terminal 17.

The semiconductor chip 11 includes a semiconductor substrate 21, a semiconductor integrated circuit 22, a plurality of electrode pads 23, and a protective film 24. The semiconductor substrate 21 is a substrate on which the semiconductor integrated circuit 22 is formed. The semiconductor substrate 21 is a substrate reduced in thickness. The thickness $T_1$ of the semiconductor substrate 21 may be 100 μm to 300 μm. The semiconductor substrate 21 may be a silicon substrate.

The semiconductor integrated circuit 22 is arranged on the front surface of the semiconductor substrate 21. The semiconductor integrated circuit 22 includes a diffusion layer (not shown) formed on the semiconductor substrate 21, an insulation layer (not shown) laminated on the semiconductor substrate 21, and vias (not shown) and wiring arranged on the laminated insulation layer and the like.

A plurality of electrode pads 23 are arranged on the semiconductor integrated circuit 22. The electrode pads 23 are electrically connected to the wiring, the vias and the diffusion layer arranged on the semiconductor integrated circuit 22. In other words, the electrode pads 23 are electrically connected to the semiconductor integrated circuit 22. The material of the electrode pads 23 may be Al.

The protective film 24 is arranged on the semiconductor integrated circuit 22. The protective film 24 is a film used to protect the semiconductor integrated circuit 22. The protective film 24 may be an SiN film or a PSG film. A laminate formed by an SiN film or a PSG film with a polyimide resin layer laminated thereon may be used as a protective film 24.

The internal connection terminal 12 is arranged on the electrode pad 23. The internal connection terminal 12 has a flat upper surface 12A. The upper surface 12A of the internal connection terminal 12 and the wiring pattern 14 are metallically combined. The internal connection terminal 12 is a terminal that electrically connects the semiconductor integrated circuit 22 and the wiring pattern 14. The height $H_1$ of the internal connection terminal 12 may be 10 μm to 60 μm. The internal connection terminal 12 may be made of an Au bump, a plated Au film, or a metallic lamination film formed by an Ni film formed by the electroless plating method and an Au film covering the Ni film. The Au bump may be formed by using a wire bonding device. The Au bump may be formed by the plating method.

The insulation layer 13 is arranged to cover the side surface of the internal connection terminal 12 and the upper surface of the semiconductor chip 11. The upper surface 12A of the internal connection terminal 12 is exposed from the insulation layer 13. The upper surface 13A of the insulation layer 13 is substantially flush with the upper surface 12A of the internal connection terminal 12.

The insulation layer 13 may be made of an insulating resin layer, an anisotropic conductive resin layer, an insulating resin layer containing a material that shields α rays and/or visible rays and ultraviolet rays, or ananisotropic conductive resin layer containing a material that shields α rays and/or visible rays and ultraviolet rays. The material of the insulation layer may be an insulating resin having the shape of an adhesive sheet such as an NCF (Non Conductive Film), a pasty insulating resin such as an NCP (Non Conductive Paste), a build-up resin (epoxy resin containing a filler), or a liquid crystal polymer.

The anisotropic conductive resin layer is a resin layer that has insulating properties in the direction of a plane substantially parallel to the upper surface 13A of the insulation layer 13 and has conductivity in the direction orthogonal to the upper surface 13A. The material of the anisotropic conductive resin layer may be an anisotropic conductive resin having the shape of an adhesive sheet such as an ACF (Anisotropic Conductive Film) or a pasty anisotropic conductive resin such as an ACP (Anisotropic Conductive Paste). The ACP or ACF is formed by an epoxy-based insulating resin including small-diameter resin spheres coated with Ni/Au dispersed therein.

The influence of α rays, visible rays and ultraviolet rays on the semiconductor device 10 will be described. α rays act on the semiconductor substrate 21 and forms an electron-hole pair. In case the semiconductor chip 11 is a semiconductor chip for memory, a software error will take place. Visible rays or ultraviolet rays generate a photoelectromotive force to cause the semiconductor device 10 to malfunction.

Materials that shield α rays, visible rays and ultraviolet rays include carbon black and a blackish organic pigment. Carbon black in this context is an aggregate of crystallites generated through combustion or decomposition by heat of a hydrocarbon or a compound containing carbon while air is not sufficiently supplied. Carbon black may be channel black, roller black, oil furnace black, gas furnace black, acetylene black, fine thermal black, medium thermal black, lamp black, bone black, turpentine soot, oil smoke or vegetable black. When the carbon black is added in an insulating resin layer or an anisotropic conductive resin layer, the carbon black is prepared in the form of powder, slurry or paste.

The organic pigment in this context is a generic name for pigments formed by organic dyes. The organic pigment has a higher coloring power and more hues than the inorganic pigment. The organic pigment may be a blackish organic pigment.

By adding carbon black or a blackish organic pigment that shields α rays, visible rays and ultraviolet rays in an insulating resin layer or an anisotropic conductive resin layer, it is possible to prevent software error related to the semiconductor chip 11 as well as possible malfunctions of the semiconductor device 10.

The detection volume of α rays in the insulation layer 13 is preferably equal to or below 0.001 count/cm$^2$·h. By making the detection volume of α rays in the insulation layer 13 to be equal to or below 0.001 count/cm$^2$·h, it is possible to further reduce the rate of occurrence of software errors. The thickness $T_2$ of the insulation layer 13 may be 10 μm to 60 μm.

The wiring pattern 14 is rewiring and has a first metallic layer 26 and a second metallic layer 27. The wiring pattern 14 has an external connection terminal arrangement region 14A where an external connection terminal 17 is disposed.

The first metallic layer 26 is arranged on the upper surface 12A of the internal connection terminal 12 and the upper surface 13A of the insulation layer 13. The first metallic layer 26 is metallically bonded to a metal (such as Au) constituting the internal connection terminal 12.

In this way, through metallic bonding of the first metallic layer 26 constituting the wiring pattern 14 and the internal connection terminal 12, bonding strength between the wiring pattern 14 and the internal connection terminal 12 is enhanced. This enhances the reliability of electric connection between the wiring pattern 14 and the internal connection terminal 12.

The first metallic layer 26 is electrically connected to the electrode pads 23 via the internal connection terminal 12. The first metallic layer 26 may be made of a Ti/Cu lamination film formed by a Ti film and a Cu film sequentially laminated one on the other or a Cr/Cu lamination film formed by a Cr film and a Cu film sequentially laminated one on the other.

By using a laminate of a Ti film or a Cr film highly adhesive to the insulation layer 13 and having a high electric resistance value and a Cu film having a low electric resistance value as a first metallic layer 26, it is possible to enhance the reliability of electric connection between the internal connection terminal 12 and the wiring pattern 14. This allows the first metallic layer 26 to be used as a power feed layer when the second metallic layer 27 is formed by the electroplating method.

In case a Ti/Cu lamination film is used as a first metallic layer 26, the Ti layer may be 0.05 μm to 2.0 μm thick and the Cu layer may be 0.2 μm to 1.5 μm thick. In case a Cr/Cu lamination film is used as a first metallic layer 26, the Cr layer may be 0.01 μm to 0.05 μm thick and the Cu layer may be 0.2 μm to 1.5 μm thick.

The second metallic layer 27 is arranged on the upper surface 26A of the first metallic layer 26. A Cu layer may be used as a second metallic layer 27. In case a Cu layer is used as a second metallic layer 27, the second metallic layer 27 may be 10 μm thick. The wiring pattern 14 of the above configuration electrically connects the internal connection terminal 23 and the external connection terminal 17 to each other.

Figure 13:
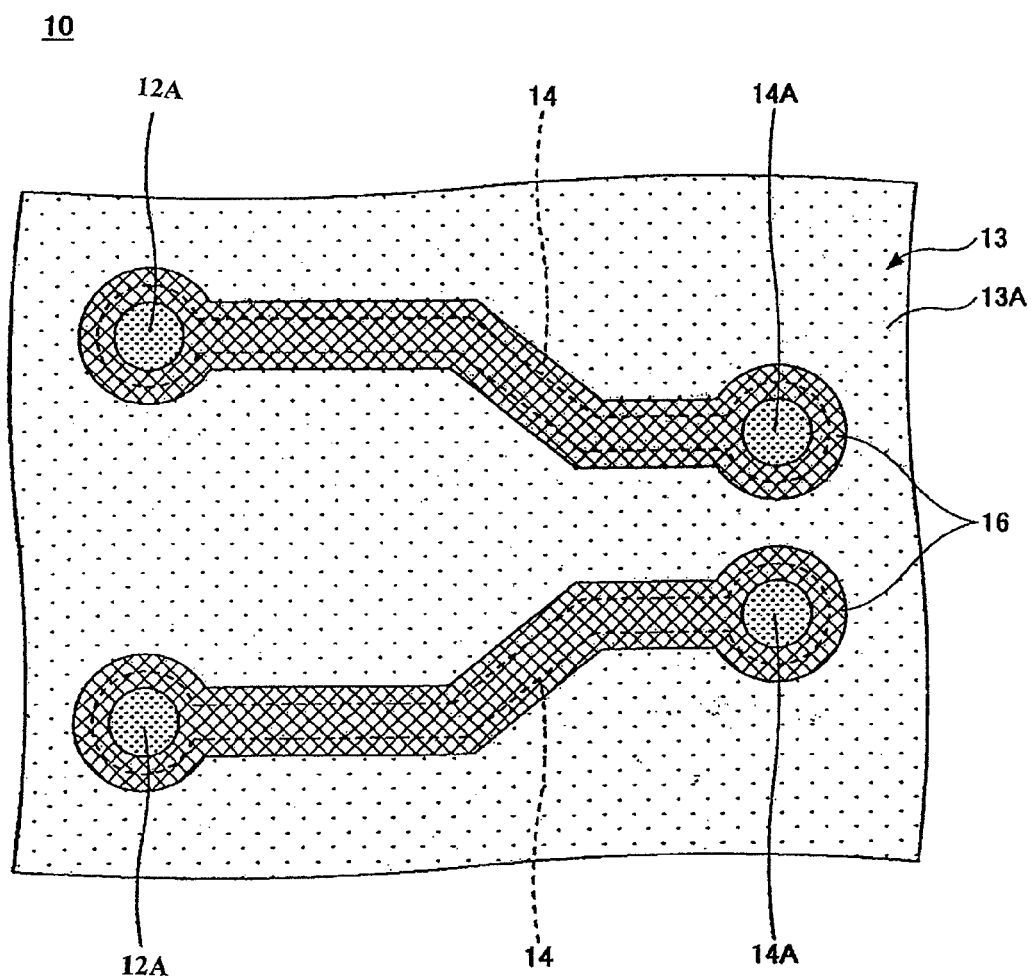
FIG. 13 is a plan view of a semiconductor device shown in FIG. 12.
Figure 14:
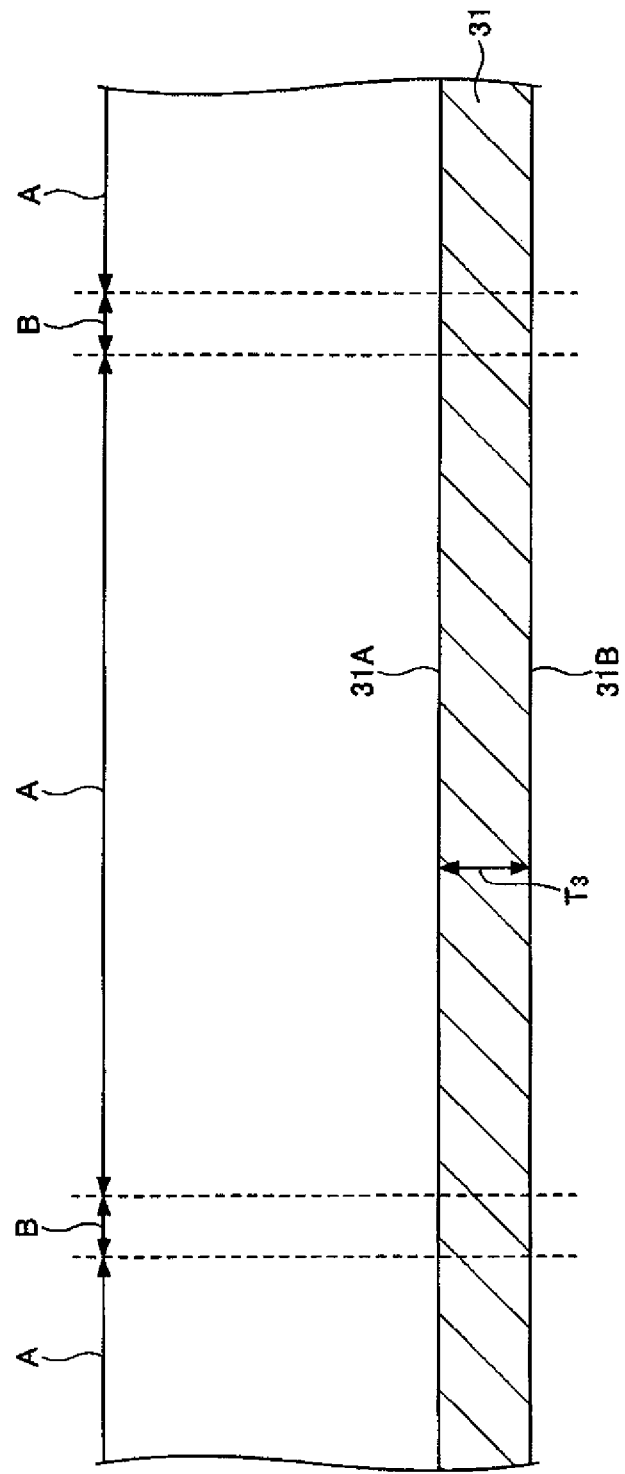
FIG. 14 shows the manufacturing processes of a semiconductor device according to an embodiment of the invention (1 of 15).

FIG. 13 is a plan view of a semiconductor device shown in FIG. 12. FIG. 13 shows a partial plan view of a semiconductor device 10. In FIG. 13, the same sign is given to the same component as that of the semiconductor device 10 according to this embodiment.

As shown in FIGS. 12 and 13, a solder resist 16 is arranged to cover the upper surface of the portion of the wiring pattern 14 not corresponding to an external connection terminal arrangement region 14A (to be precise, the upper surface 27A of the second metallic layer 27) and the side surface 14D of the wiring pattern 14 and includes an opening 16B that exposes the external connection terminal arrangement region 14A. The area of the portion of the solder resist 16 visible when the upper surface 13A of the insulation layer 13 is viewed from above (the state shown in FIG. 13) is substantially the same as that of the portion of the wiring pattern 14 visible when the upper surface 13A of the insulation layer 13 is viewed from above.

The solder resist 16 is arranged to cover the upper surface of the portion of wiring pattern 14 not corresponding to the external connection terminal arrangement region 14A (to be precise, the upper surface 27A of the second metallic layer 27) and the side surface 14B of the wiring pattern 14. The area of the portion of the solder resist 16 visible when the upper surface 13A of the insulation layer 13 is viewed from above (the state shown in FIG. 13) is substantially the same as that of the portion of the wiring pattern 14 visible when the upper surface 13A of the insulation layer 13 is viewed from above. This makes it possible to reduce the area of the forming region of the solder resist 16 formed on one surface of the semiconductor device 10 to the minimum necessary size, thereby reducing warpage of the semiconductor device 10 caused by the solder resist 16.

The thickness of the portion of the solder resist 16 arranged on the upper surface of the wiring pattern 14 (to be precise, the upper surface 27A of the second metallic layer 27) may be 10 to 30 μm. In this case, the thickness of the portion of the solder resist 16 arranged on the side surface 14B of the wiring pattern 14 may be 20 to 50 μm.

The area of the portion of the upper surface 13A of the insulation layer 13 corresponding to the forming region of the wiring pattern 14 is preferably smaller than that of the upper surface 13A of the portion of the insulation layer 13 except the forming region of the wiring pattern 14.

By making the area of the upper surface 13A of the portion of the insulation layer 13 corresponding to the forming region of the wiring pattern 14 smaller than that of the upper surface 13A of the portion of the insulation layer 13 except the forming region of the wiring pattern 14, it is possible to further reduce the area of the portion of the solder resist 16 visible when the upper surface 13A of the insulation layer 13 is viewed from above (the state shown in FIG. 13), thereby reducing the warpage of the semiconductor device 10 caused by the solder resist 16.

The external connection terminal 17 is arranged in the external connection terminal arrangement region 14A of the wiring pattern 14. The external connection terminal 17 is a terminal electrically connected to a pad arranged on a mounting board (not shown) such as a motherboard. The external connection terminal 17 may be made of a solder bump. In case a solder bump is used as an external connection terminal 17, the material of the external connection terminal 17 may be an alloy containing Pb, an alloy of Sn and Cu, or an alloy of Sn and Ag.

With the semiconductor device according to this embodiment, a solder resist 16 is arranged to cover the upper surface of the portion of the wiring pattern 14 not corresponding to an external connection terminal arrangement region 14A (to be precise, the upper surface 27A of the second metallic layer 27) and the side surface 14B of the wiring pattern 14. The area of the portion of the solder resist 16 visible when the upper surface 13A of the insulation layer 13 is viewed from above (the state shown in FIG. 13) is substantially the same as that of the portion of the wiring pattern 14 visible when the upper surface 13A of the insulation layer 13 is viewed from above. This makes it possible to reduce the area of the forming region of the solder resist 16 formed on one surface of the semiconductor device 10 to the minimum necessary size, thereby reducing warpage of the semiconductor device 10 caused by the solder resist 16.

The area of the upper surface 13A of the portion of the insulation layer 13 corresponding to the forming region of the wiring pattern 14 is smaller than that of the upper surface 13A of the insulation layer 13 except the forming region of the wiring pattern 14. This makes it possible to reduce the area of the portion of the solder resist 16 visible when the upper surface 13A of the insulation layer 13 is viewed from above (the state shown in FIG. 13), thereby reducing the warpage of the semiconductor device 10 caused by the solder resist 16.

FIGS. 14 to 28 show the manufacturing processes of a semiconductor device according to an embodiment of the invention. In FIGS. 14 to 28, the same sign is given to the same component as that of the semiconductor device 10 according to this embodiment. In FIGS. 14 to 28, a sign A represents a region where a semiconductor chip 11 is formed (hereinafter referred to as the "chip forming region A") and a sign B a region cut off when a plurality of semiconductor devices 10 are singulated (hereinafter referred to as the "cutting region B").

The method for manufacturing the semiconductor device 10 according to this embodiment will be described referring to FIGS. 14 to 28. First, in the process shown in FIG. 14, a base material 31 is prepared having a plurality of chip forming regions A and a cutting region B arranged to surround the plurality of chip forming regions A. The base material 31 is reduced in thickness and cut off at the cutting region B to form a semiconductor substrate 21 shown in FIG. 12. The base material 31 may be a silicon wafer. The thickness $T_3$ of the base material 31 may be 500 μm to 775 μm.

Figure 15:
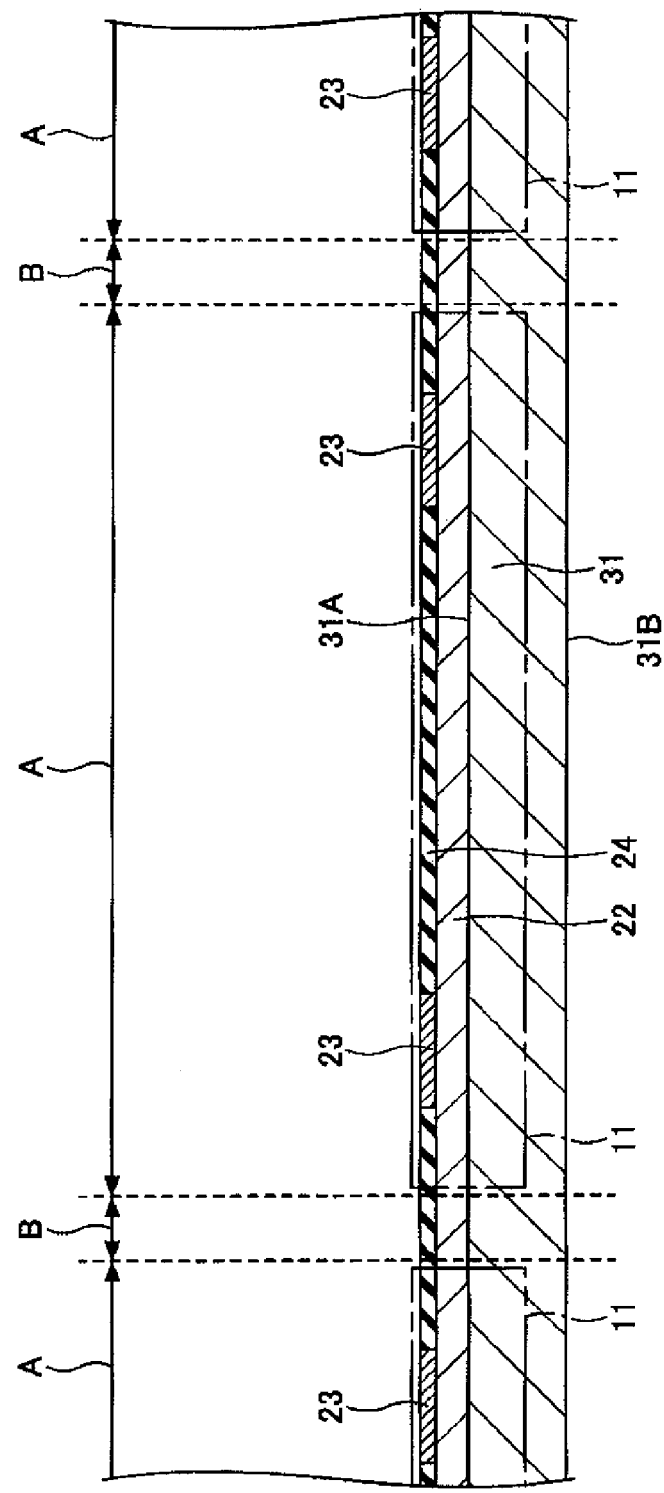
FIG. 15 shows the manufacturing processes of a semiconductor device according to an embodiment of the invention (2 of 15).

Next, in the process shown in FIG. 15, a semiconductor integrated circuit 22, electrode pads 23 and a protective film 24 are sequentially formed on the front surface 31A of the base material 31 by way of a known technique. This forms a structure corresponding to the semiconductor chip 11 on the portion of the base material 31 corresponding to the chip forming region A (chip forming process). The material of the electrode pad 23 may be Al. The protective film 24 may be made of an SiN film or a PSG film. The protective film 24 may be formed by laminating a polyimide resin layer on a film such as an SiN film or a PSG film.

Figure 16:
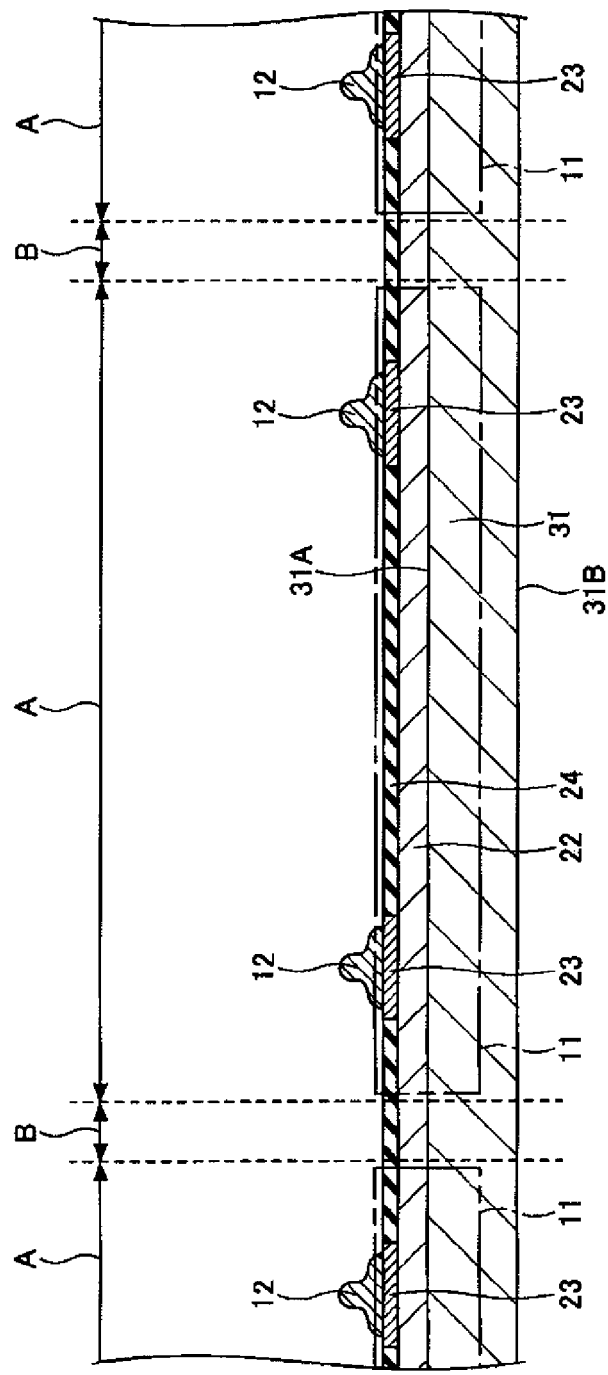
FIG. 16 shows the manufacturing processes of a semiconductor device according to an embodiment of the invention (3 of 15).

Next, in the process shown in FIG. 16, an internal connection terminal 12 is formed on each of the plurality of electrode pads 23. The internal connection terminal 12 may be made of an Au bump, a plated Au film, or a metallic lamination film formed by an Ni film formed by the electroless plating method and an Au film covering the Ni film. The Au bump may be formed by using a wire bonding device. The Au bump may be formed by the plating method. Note that there are variations in height between the plurality of internal connection terminals 12 formed in the process shown in FIG. 16.

Figure 17:
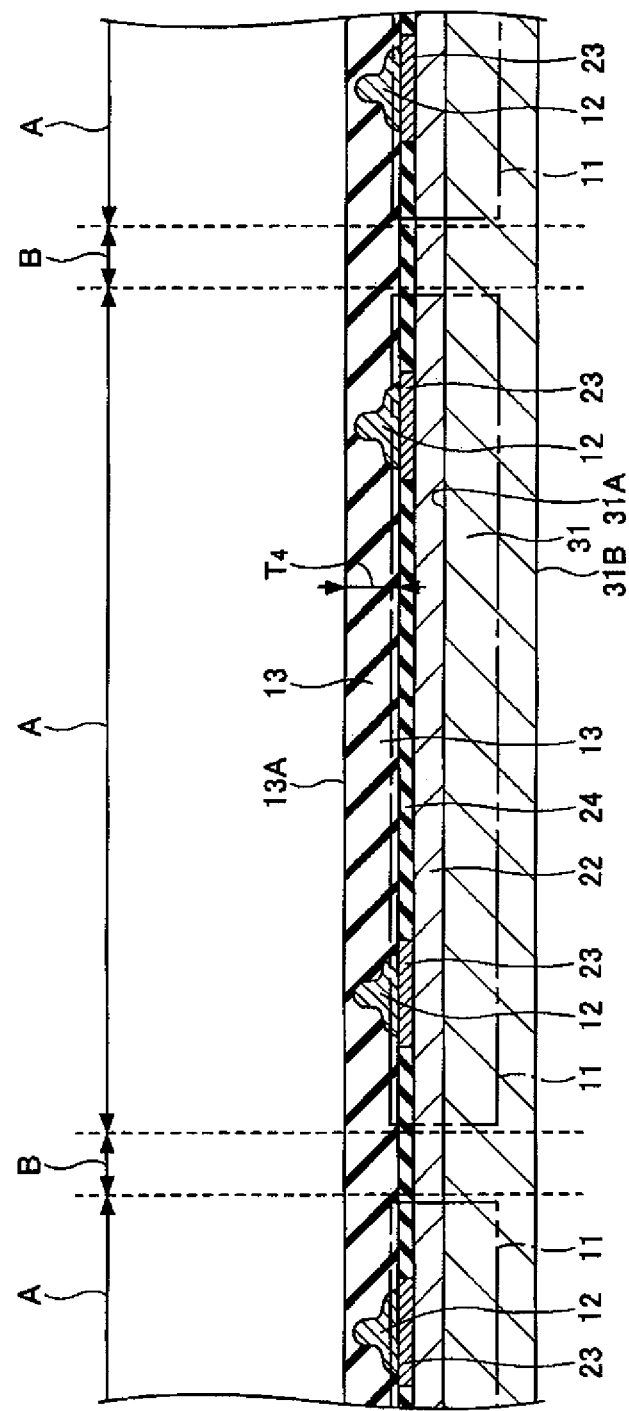
FIG. 17 shows the manufacturing processes of a semiconductor device according to an embodiment of the invention (4 of 15).

Next, in the process shown in FIG. 17, an insulation layer 13 is formed to cover the upper surface of the structure and the plurality of internal connection terminals 12 shown in FIG. 16. The insulation layer 13 may be made of a build-up resin (epoxy resin containing a filler), a liquid crystal polymer, an insulating resin layer such as an NCF (Non Conductive Film) or an NCP (Non Conductive Paste), an anisotropic conductive resin layer such as an ACF (Anisotropic Conductive Film) or an ACP (Anisotropic Conductive Paste), an insulating resin layer containing a material that shields α rays and/or visible rays and ultraviolet rays, or an anisotropic conductive resin layer containing a material that shields α rays and/or visible rays and ultraviolet rays. Materials that shield α rays, visible rays and ultraviolet rays include carbon black and a blackish organic pigment. Carbon black in this context is an aggregate of crystallites generated through combustion or decomposition by heat of a hydrocarbon or a compound containing carbon while air is not sufficiently supplied. Carbon black may be channel black, roller black, oil furnace black, gas furnace black, acetylene black, fine thermal black, medium thermal black, lamp black, bone black, turpentine soot, oil smoke or vegetable black. When the carbon black is added in an insulating resin layer or an anisotropic conductive resin layer, the carbon black is prepared in the form of powder, slurry or paste.

The organic pigment in this context is a generic name for pigments formed by organic dyes. The organic pigment has a higher coloring power and more hues than the inorganic pigment. The organic pigment may be a blackish organic pigment.

By adding carbon black or a blackish organic pigment that shields α rays, visible rays and ultraviolet rays in an insulating resin layer or an anisotropic conductive resin layer, it is possible to prevent software error related to the semiconductor chip 11 as well as possible malfunctions of the semiconductor device 10.

In case an insulating resin layer having the shape of an adhesive sheet or a sheet-shaped anisotropic conductive resin layer is used in the process shown in FIG. 17, the sheet-shaped insulating resin or anisotropic conductive resin is bonded to the upper surface of the structure shown in FIG. 16 to form an insulation layer 13. In case a pasty insulating resin or anisotropic conductive resin is used as an insulation layer 13, a pasty insulating resin or a pasty anisotropic conductive resin is formed on the upper surface of the structure shown in FIG. 16 by way of the printing method followed by pre-baking to semi-cure the insulating resin or anisotropic conductive resin. The semi-cured insulating resin or anisotropic conductive resin is adhesive. The thickness $T_4$ of the insulation layer 13 may be 20 μm to 100 μm.

Figure 18:
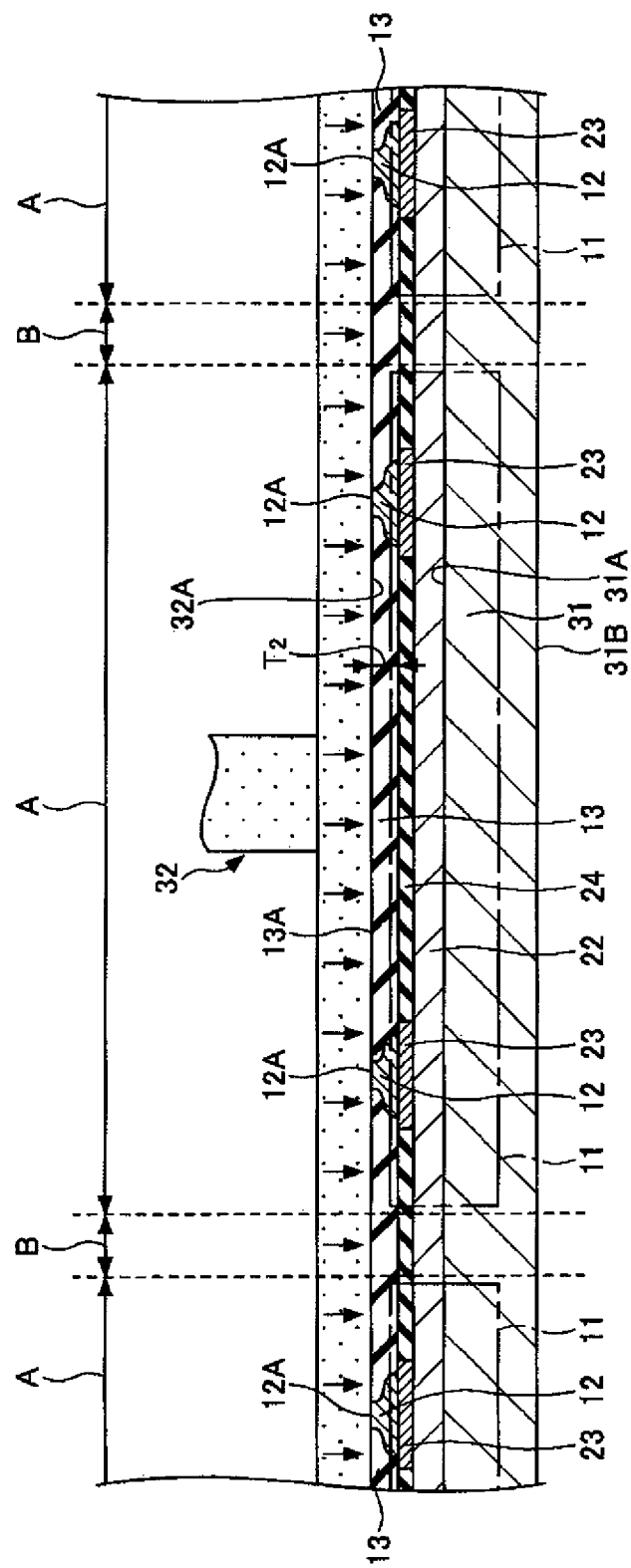
FIG. 18 shows the manufacturing processes of a semiconductor device according to an embodiment of the invention (5 of 15).

Next, in the process shown in FIG. 18, the upper surface 13A of the insulation layer 13 is pressed with a substantially uniform pressure with the structure shown in FIG. 17 heated to form a flat upper surface 12A on the upper end of the internal connection terminal 12. The upper surface 12A of the internal connection terminal 12 thus becomes substantially flush with the upper surface 13A of the insulation layer 13 and the insulation layer 13 is cured. In the process shown in FIG. 18, for example, a flat plate 32 having a flat surface 32A that is in contact with the upper surface 13A of the insulation layer 13 is used to press the insulation layer 13. The thickness $T_2$ of the cured insulation layer 13 may be 10 μm to 60 μm. In this stage, a material constituting the insulation layer 13 adheres to the upper surface 12A of the internal connection terminal 12, so that the upper surface 12A of the internal connection terminal 12 is not fully exposed from the insulation layer 13.

Figure 19:
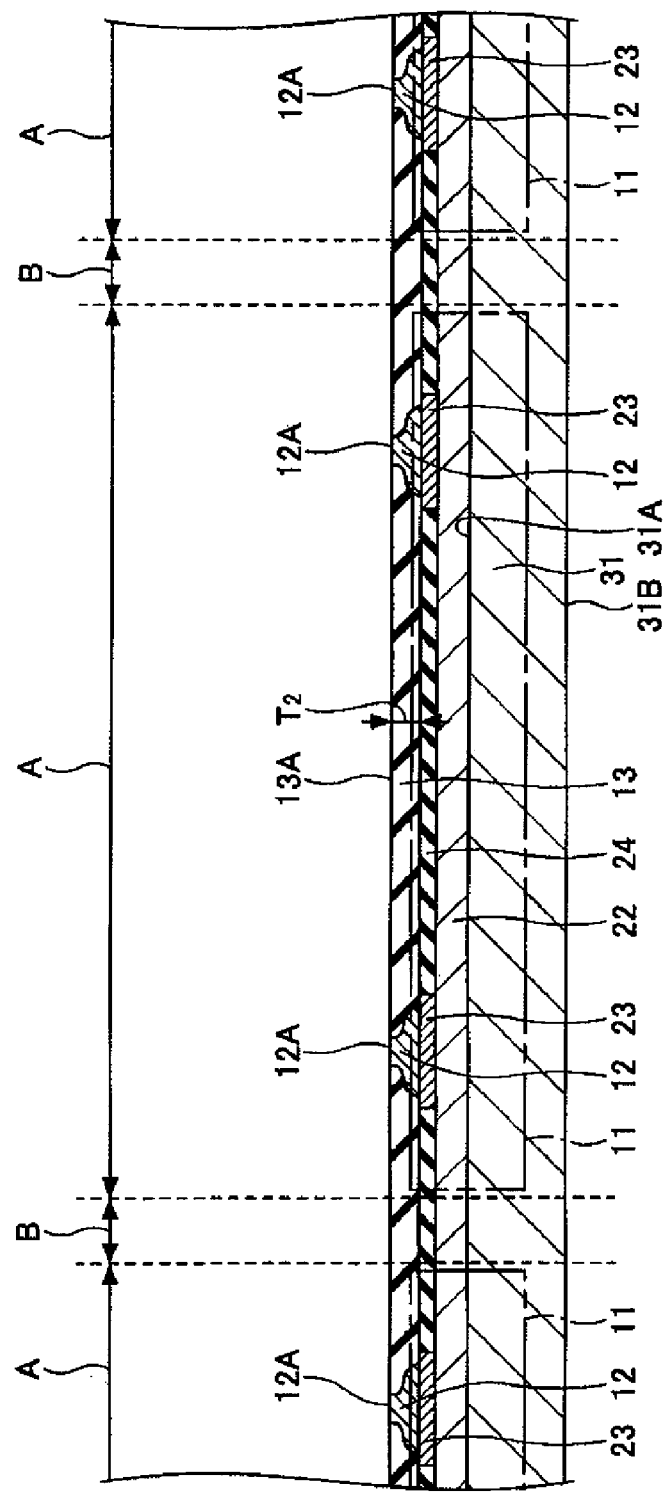
FIG. 19 shows the manufacturing processes of a semiconductor device according to an embodiment of the invention (6 of 15).

In the process shown in FIG. 19, the upper surface 12A of the internal connection terminal 12 is fully exposed from the insulation layer 13 by way of an ashing process and the upper surface 13A of the insulation layer 13 is roughened. The ashing process may use $O_2$ plasma ashing. The $O_2$ plasma ashing refers to an ashing process in which a target substance is oxidized by oxygen radicals and oxygen ions with oxygen gas plasma-activated in a vacuum atmosphere to remove the target substance as a gaseous reaction product such as CO or $CO_2$.

In case the $O_2$ plasma ashing is used, a variety of inert gases may be added in the oxygen gas as required. Inert gases to be added in the oxygen gas include a hydrogen-based gas, a nitrogen-based gas, and CF gases such as $CF_4$ and $C_2F_6$. In the process shown in FIG. 19, ozone ashing may be used instead of $O_2$ ashing. In this case, a sufficient etching characteristic is not obtained depending on the material of the insulation layer 13. To be more precise, for example, an etching rate of etching the insulation layer 13 is lowered. Thus, it is necessary to pay attention to the etching time.

The upper surface 13A of the insulation layer 13 after ashing is roughened to form minute asperities thereon. The upper surface 13A of the insulation layer 13 is roughened to cause a first metallic layer 26 formed in the process shown in FIG. 20 described later to enter the minute asperities formed on the upper surface 13A of the insulation layer 13, that is, the anchor effect takes place, thus enhancing the adhesion of the upper surface 13A of the insulation layer 13 to the first metallic layer 26.

The shape of minute asperities formed on the upper surface 13A of the insulation layer 13 also transferred to the upper surface 26A of the first metallic layer 26, thus enhancing the adhesion of the first metallic layer 26 to the second metallic layer 27.

When the upper surface 13A of the insulation layer 13 is roughened, a method may be used where a copper foil is arranged on the upper surface 13A of the insulation layer 13, pressed and removed to transfer the rough surface of the copper foil on the upper surface 13A of the insulation layer 13. This method complicates the manufacturing process and requires an additional material cost of the copper foil, thereby increasing the manufacturing cost of the semiconductor device 10. On the other hand, the method for roughening the upper surface 13A of the insulation layer 13 via ashing does not trigger this problem (an increase in the manufacturing cost).

Figure 20:
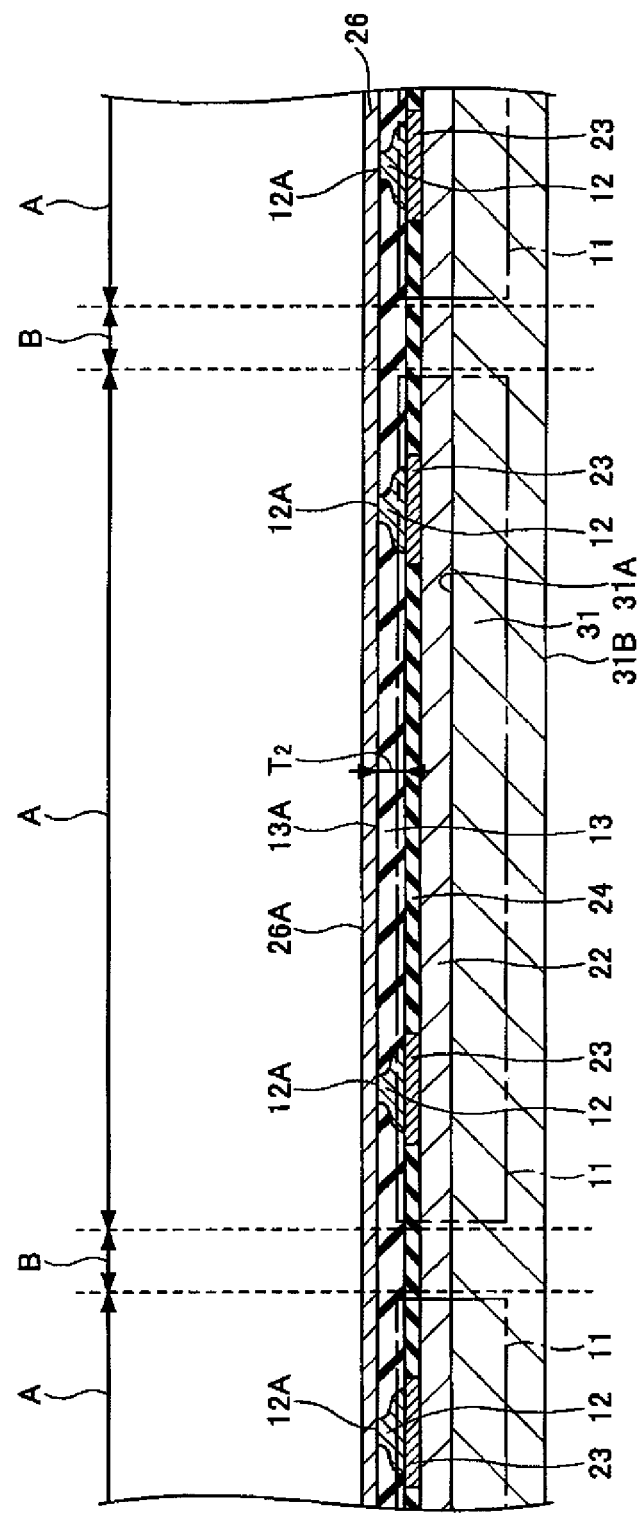
FIG. 20 shows the manufacturing processes of a semiconductor device according to an embodiment of the invention (7 of 15).

Next, in the process shown in FIG. 20, the first metallic layer 26 is formed on the upper surface 13A of the insulation layer 13 and the upper surface 12A of the internal connection terminal 12. The first metallic layer 26 may be formed by using the sputtering method, vacuum deposition method, ion plating method, or CVD method. The first metallic layer 26 is preferably formed by using the sputtering method.

By forming the first metallic layer 26 with the sputtering method, it is possible to provide a close-grained film quality of the first metallic layer 26 as well as provide metallic bonding of the internal connection terminal 12 to the first metallic layer 26 to enhance the adhesion of the internal connection terminal 12 to the first metallic layer 26. It is to also possible to provide metallic bonding of the internal connection terminal 12 to the first metallic layer 26 even in case the vacuum deposition method or ion plating method is used instead of the sputtering method to form the first metallic layer 26.

The first metallic layer 26 may be made of a Ti/Cu lamination film formed by a Ti film and a Cu film sequentially laminated one on the other or a Cr/Cu lamination film formed by a Cr film and a Cu film sequentially laminated one on the other.

By using a laminate of a Ti film or a Cr film highly adhesive to the insulation layer 13 and having a high electric resistance value and a Cu film having a low electric resistance value as a first metallic layer 26, it is possible to enhance the reliability of electric connection between the internal connection terminal 12 and the wiring pattern 14. This allows the first metallic layer 26 to be used as a power feed layer when the second metallic layer 27 is formed by the electroplating method.

In case a Ti/Cu lamination film is used as a first metallic layer 26, the Ti film may be 0.05 μm to 2 μm thick and the Cu film may be 0.2 μm to 1.5 μm thick. In case a Cr/Cu lamination film is used as a first metallic layer 26, the Cr film may be 0.01 μm to 0.05 μm thick and the Cu film may be 0.2 μm to 1.5 μm thick.

Figure 21:
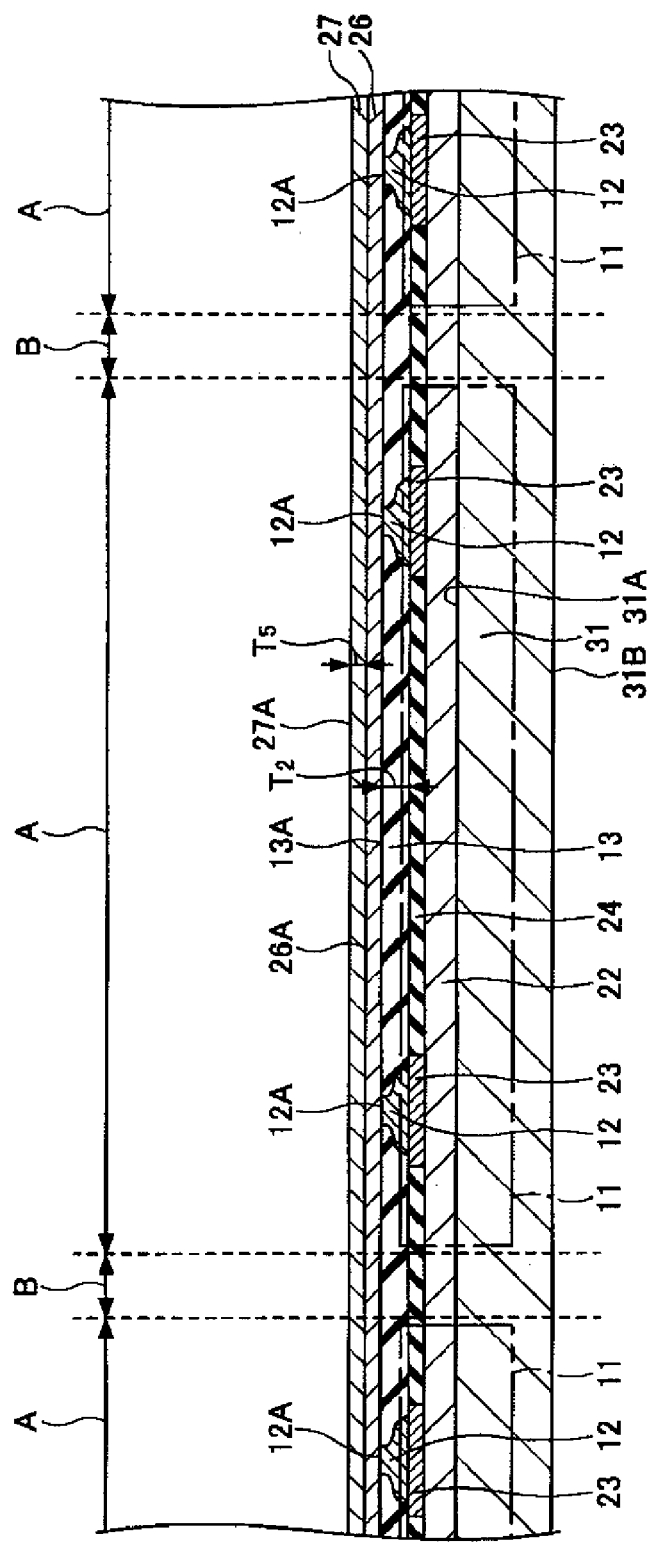
FIG. 21 shows the manufacturing processes of a semiconductor device according to an embodiment of the invention (8 of 15).

Next, in the process shown in FIG. 21, the second metallic layer 27 is formed to cover the upper surface 26A of the metallic layer 26. The second metallic layer 27 may be formed by way of the electroplating method using the first metallic layer 26 as a power feed layer. The second metallic layer 27 may be made of a Cu layer. In case a Cu layer is used as a second metallic layer 27, the thickness $T_5$ of the second metallic layer 27 may be 10 μm.

Figure 22:
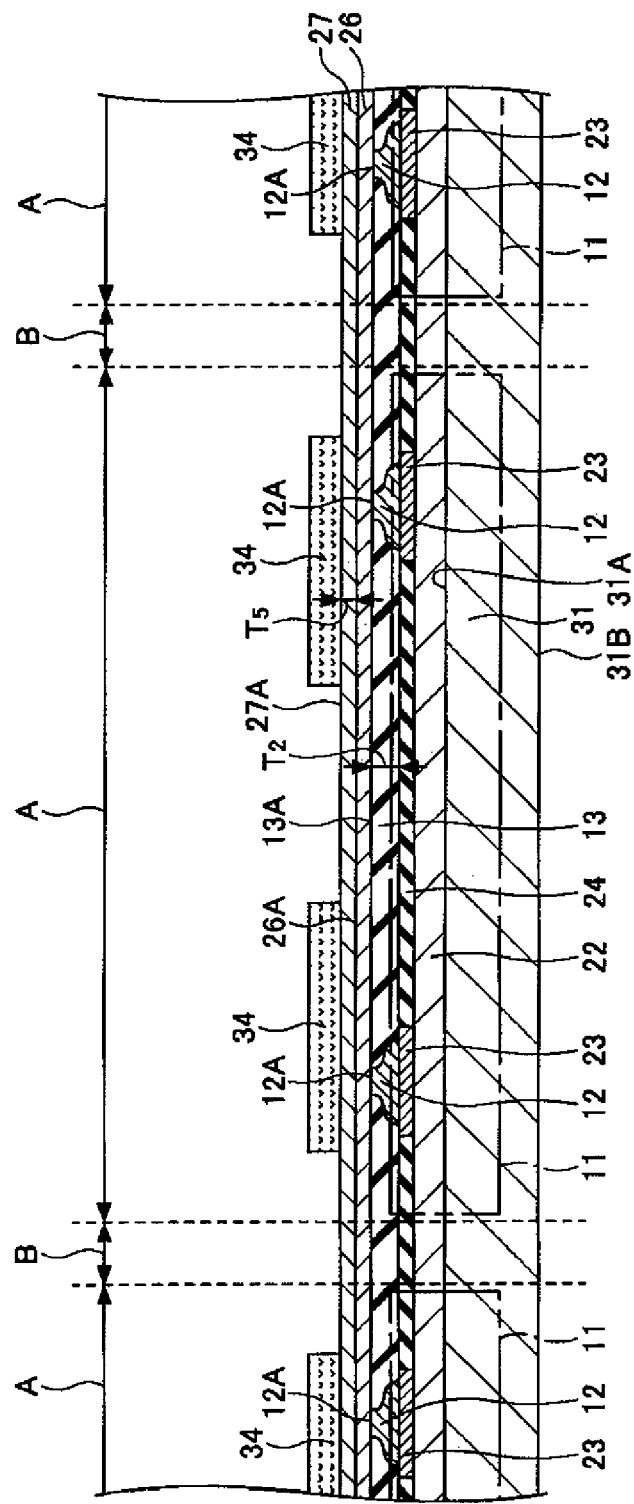
FIG. 22 shows the manufacturing processes of a semiconductor device according to an embodiment of the invention (9 of 15).

Next, in the process shown in FIG. 22, a resist film 34 covering the upper surface 27A of the portion of the second metallic layer 27 corresponding to the forming region of the wiring pattern 14 is formed.

Figure 23:
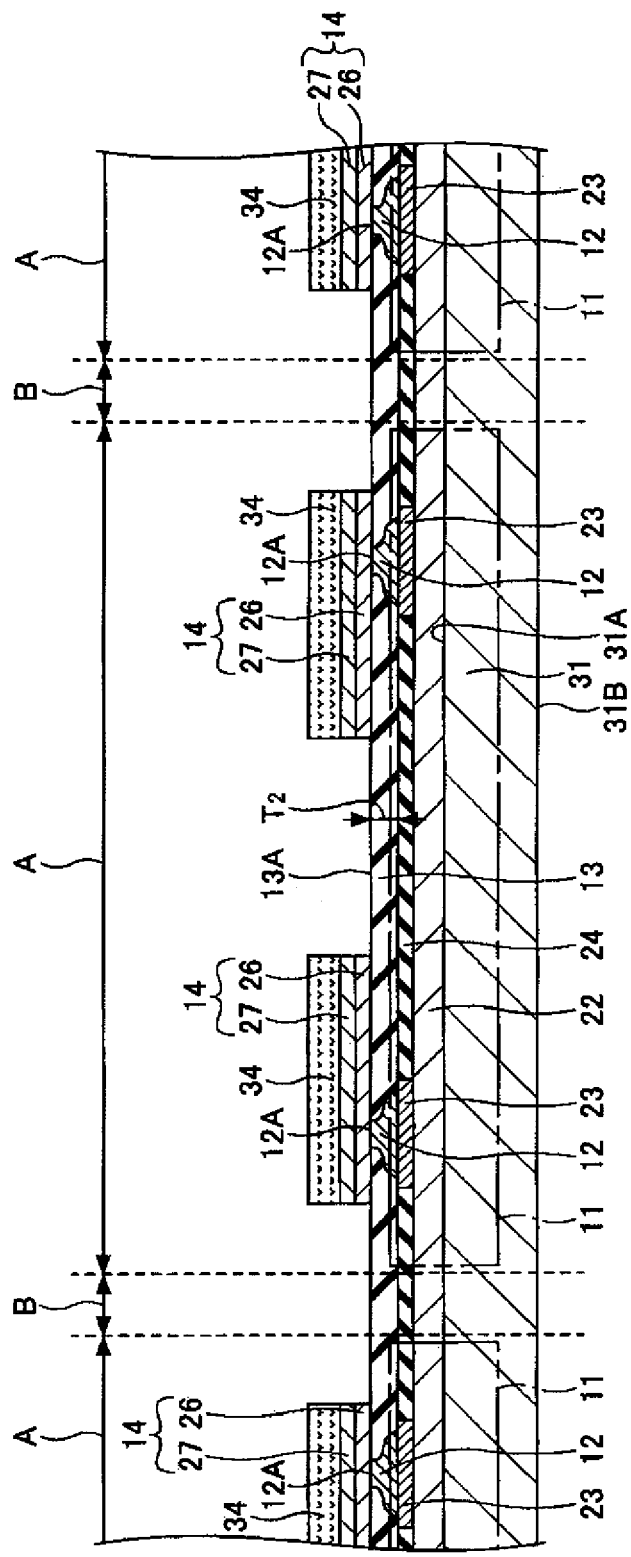
FIG. 23 shows the manufacturing processes of a semiconductor device according to an embodiment of the invention (10 of 15).

Next, in the process shown in FIG. 23, a wiring pattern 14 is formed by removing the portions of the first and second metallic layers 26, 27 not covered by the resist film 34 by way of etching that uses the resist film 34 as a mask. In other words, the wiring pattern 14 is formed with the subtractive method.

Figure 24:
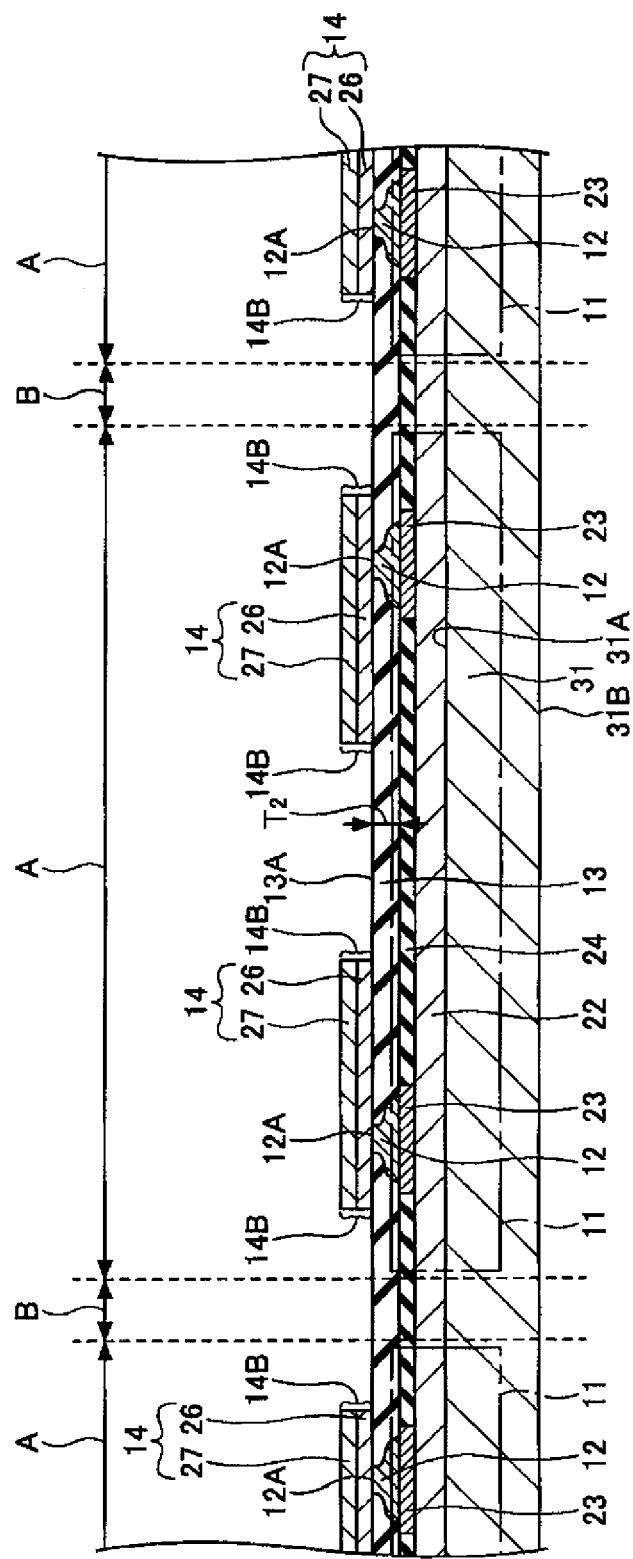
FIG. 24 shows the manufacturing processes of a semiconductor device according to an embodiment of the invention (11 of 15).

Next, in the process shown in FIG. 24, the resist film 34 shown in FIG. 23 is removed and then the surface of the wiring pattern 14 is roughened (roughening process). The roughening process of the wiring pattern 14 may be made with the blackening process or roughening etching process.

By roughening the surface of the wiring pattern 14 before forming the solder resist 16, it is possible to enhance the adhesion of the wiring pattern 14 to the solder resist 16.

Figure 25:
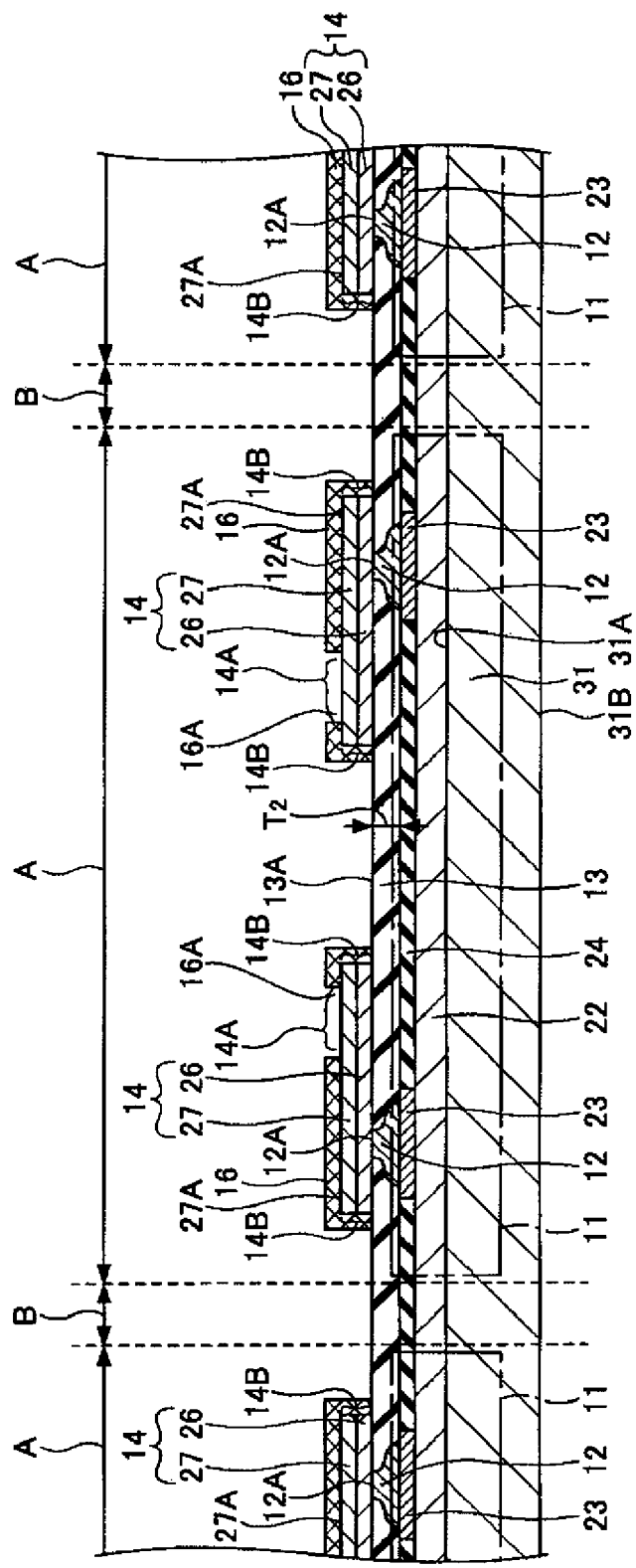
FIG. 25 shows the manufacturing processes of a semiconductor device according to an embodiment of the invention (12 of 15).

Next, in the process shown in FIG. 25, the solder resist 16 is formed to cover the upper surface of the portion of the wiring pattern 14 not corresponding to the external connection terminal arrangement region 14A (to be precise, the upper surface 27A of the second metallic layer 27) and the side surface 14B of the wiring pattern 14. The area of the portion of the solder resist 16 visible when the upper surface 13A of the insulation layer 13 is viewed from above (the state shown in FIG. 13) is substantially the same as that of the portion of the wiring pattern 14 visible when the upper surface 13A of the insulation layer 13 is viewed from above (solder resist forming process). The solder resist 16 may be formed with the photolithography method.

By covering the solder resist 16 so as to cover the upper surface of the portion of the wiring pattern 14 not corresponding to the external connection terminal arrangement region 14A (to be precise, the upper surface 27A of the second metallic layer 27) and the side surface 14B of the wiring pattern 14 and forming the solder resist 16 so that the area of the portion of the solder resist 16 visible when the upper surface 13A of the insulation layer 13 is viewed from above (the state shown in FIG. 13) will be substantially the same as that of the portion of the wiring pattern 14 visible when the upper surface 13A of the insulation layer 13 is viewed from above, it is possible to reduce the area of the forming region of the solder resist 16 formed on one surface of the semiconductor device 10 to the minimum necessary size, thereby reducing warpage of the semiconductor device 10 caused by the solder resist 16.

The thickness of the portion of the solder resist 16 arranged on the upper surface of the wiring pattern 14 (to be precise, the upper surface 27A of the second metallic layer 27) may be 10 to 30 μm. In this case, the thickness of the portion of solder resist 16 arranged on the side surface 14B of the wiring pattern 14 may be 20 to 50 μm.

Figure 26:
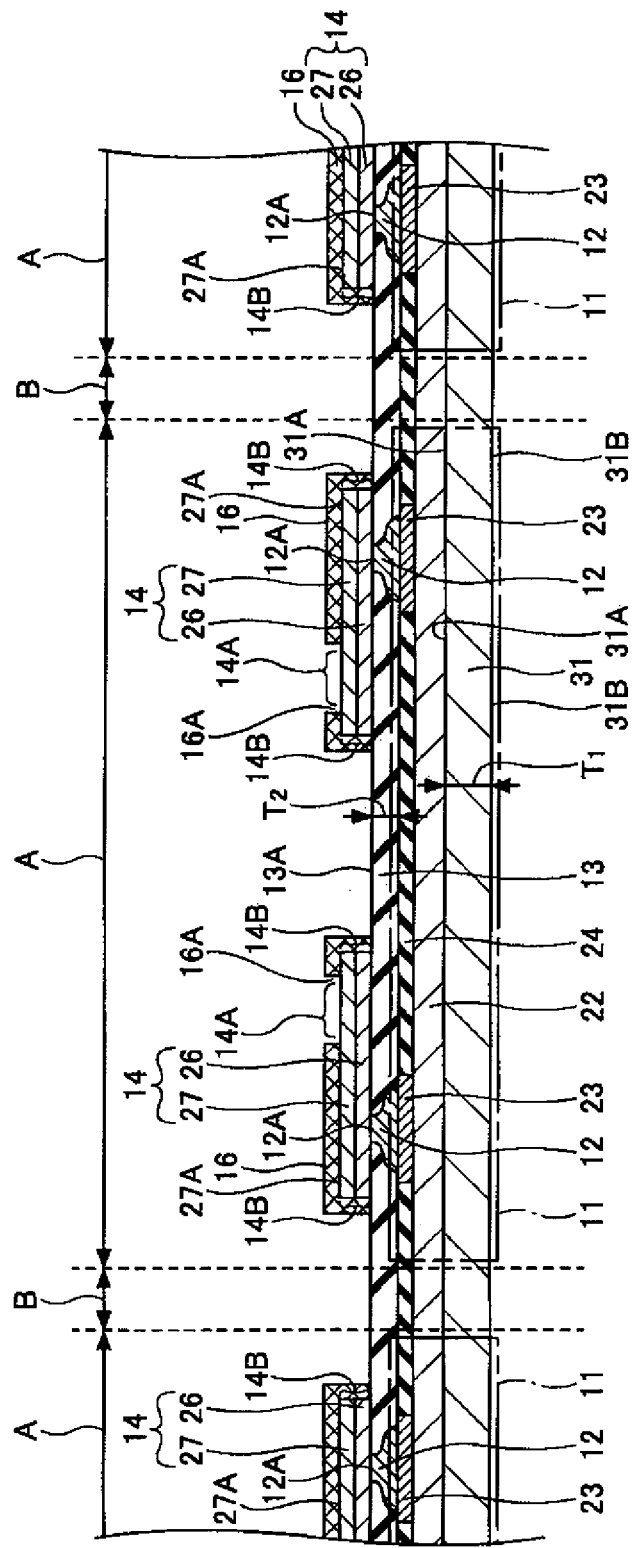
FIG. 26 shows the manufacturing processes of a semiconductor device according to an embodiment of the invention (13 of 15).

Next, in the process shown in FIG. 26, the base material 31 is polished or ground from the rear side 31B of the base material 31 to thin the base material 31. Thinning of the base material 31 may use a back side grinder. The thickness $T_1$ of the base material 31 reduced in thickness may be 100 μm to 300 μm. The process shown in FIG. 26 may be skipped.

Figure 27:
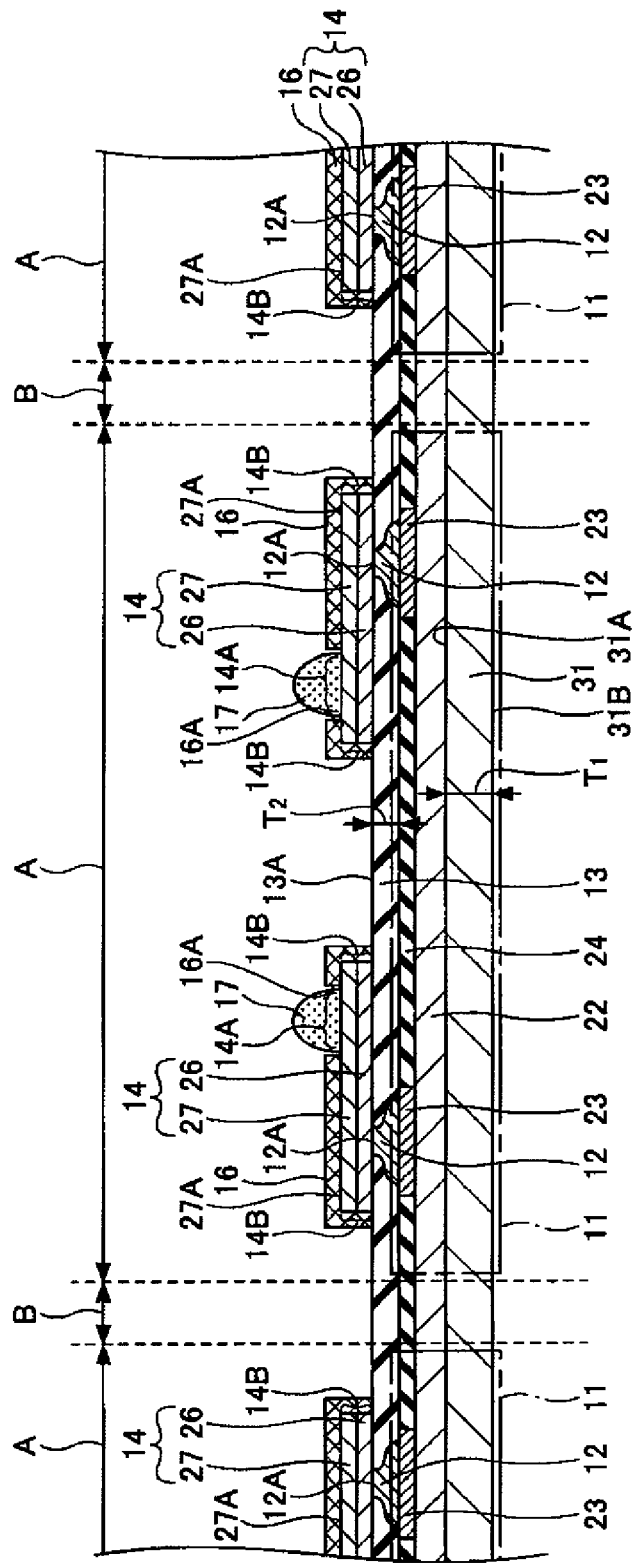
FIG. 27 shows the manufacturing processes of a semiconductor device according to an embodiment of the invention (14 of 15).

Next, in the process shown in FIG. 27, an external connection terminal 17 is formed in the external connection terminal arrangement region 14A of the wiring pattern 14 (external connection terminal forming process). This forms a structure corresponding to the semiconductor device 10 in a plurality of chip forming regions A. The external connection terminal 17 may be made of a solder bump. In case a solder bump is used as an external connection terminal 17, the material of the external connection terminal 17 may be an alloy containing Pb, an alloy of Sn and Cu, or an alloy of Sn and Ag. The process shown in FIG. 26 may be interchanged with the process shown in FIG. 27.

Figure 28:
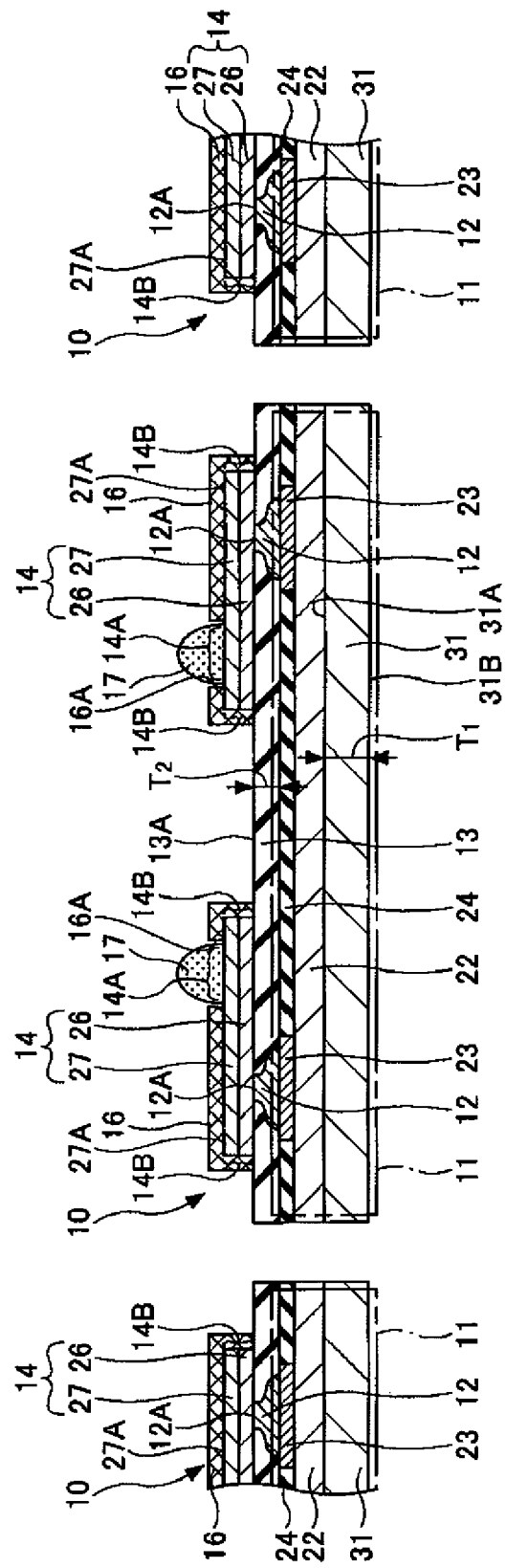
FIG. 28 shows the manufacturing processes of a semiconductor device according to an embodiment of the invention (15 of 15).

Next, in the process shown in FIG. 28, the cutting region B of the structure shown in FIG. 27 is cut off to singulate a plurality of semiconductor chips 11 (chip singulating process). This produces a plurality of semiconductor devices 10. Cutoff of the cutting region B may use dicing.

With the method for manufacturing a semiconductor device according to this embodiment, it is possible to reduce the area of the forming region of the solder resist 16 formed on one surface of the semiconductor device 10 to the minimum necessary size, thereby reducing warpage of the semiconductor device 10 caused by the solder resist 16 by covering the solder resist 16 so as to cover the upper surface of the portion of the wiring pattern 14 not corresponding to the external connection terminal arrangement region 14A (to be precise, the upper surface 27A of the second metallic layer 27) and the side surface 14B of the wiring pattern 14 and forming the solder resist 16 so that the area of the portion of the solder resist 16 visible when the upper surface 13A of the insulation layer 13 is viewed from above (the state shown in FIG. 13) will be substantially the same as that of the portion of the wiring pattern 14 visible when the upper surface 13A of the insulation layer 13 is viewed from above.

FIGS. 29 to 32 show the manufacturing processes of a semiconductor device according to an variant of the embodiment of the invention. In FIGS. 29 to 32, the same sign is given to the same component as that of the semiconductor device 10 according to this embodiment.

The method for manufacturing a semiconductor device according to an variant of the embodiment of the invention will be described referring to FIGS. 29 to 32. First, the same processes as those shown in FIGS. 14 to 20 are made to form a structure shown in FIG. 20.

Figure 29:
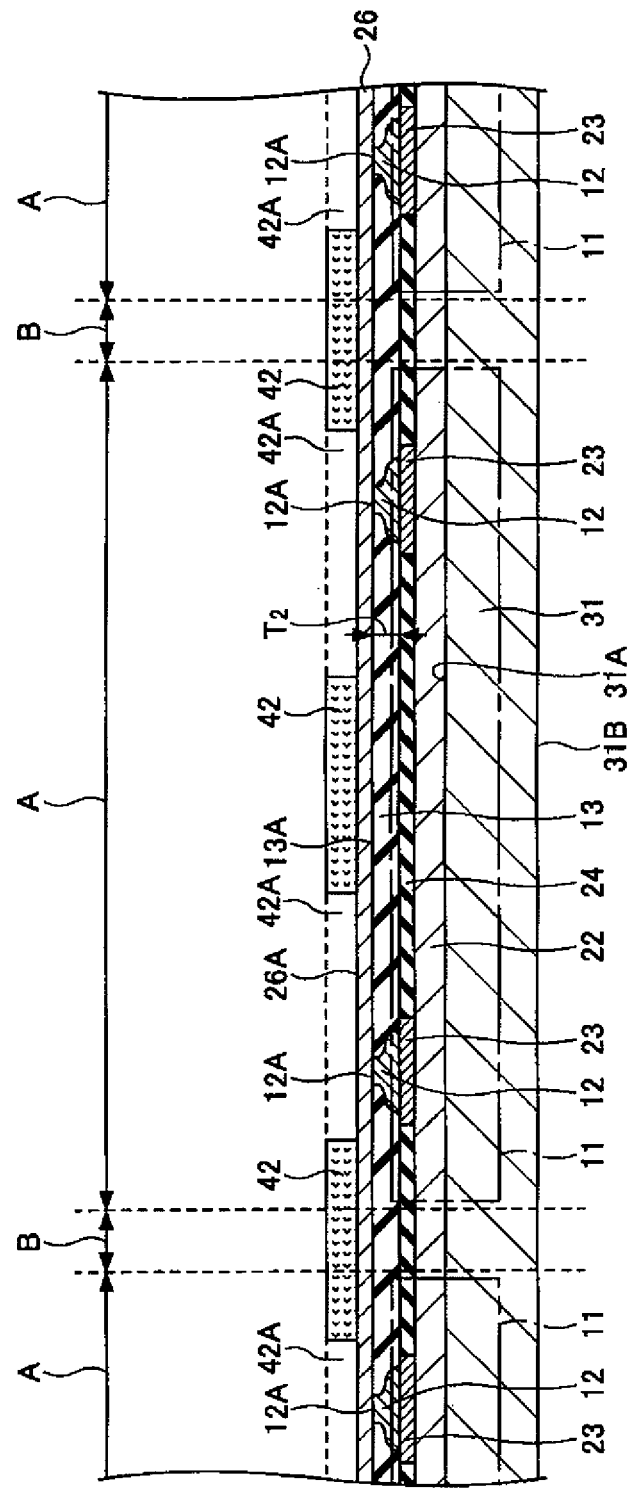
FIG. 29 shows the manufacturing processes of a semiconductor device according to a variant of the embodiment of the invention (1 of 4).

Next, in the process shown in FIG. 29, a resist film 42 including an opening 42A is formed on the upper surface 26A of the first metallic layer 26. The opening 42A is formed so as to expose the upper surface 26A of the portion of the first metallic layer 26 corresponding to the forming region of the second metallic layer 27. The resist film 42 is a resist film for soldering.

Figure 30:
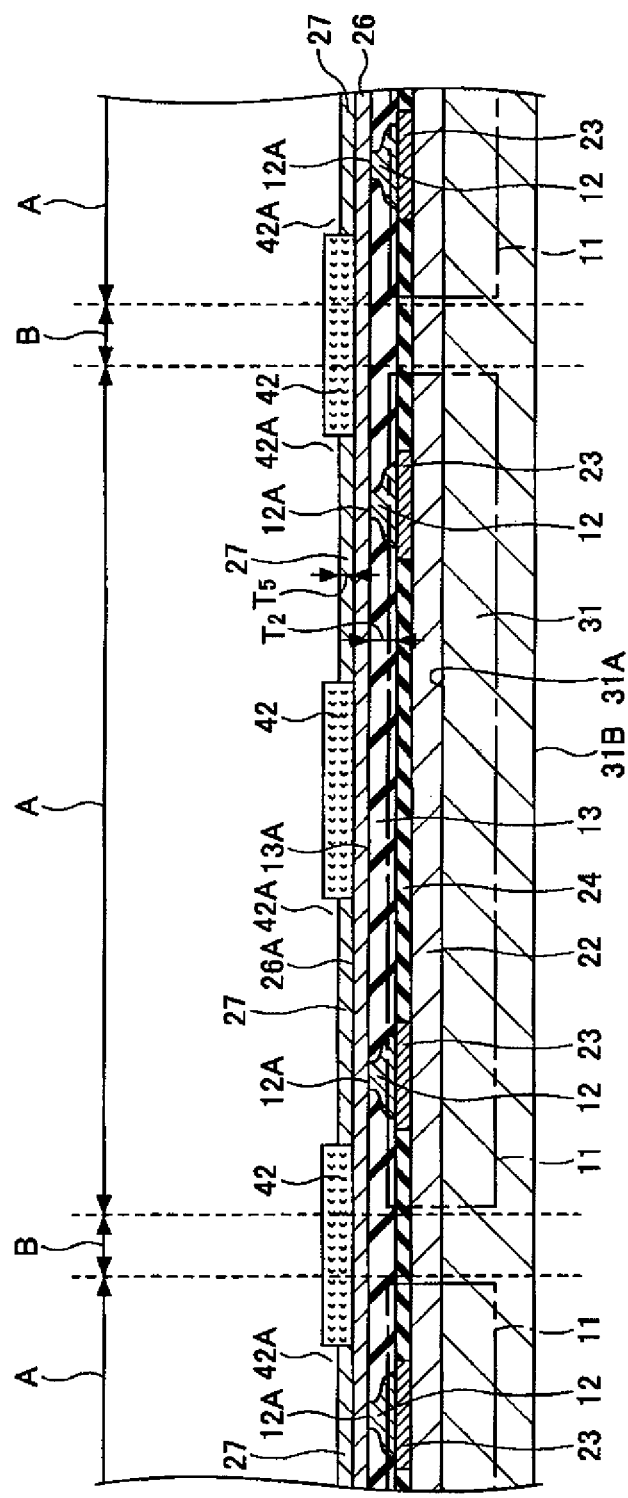
FIG. 30 shows the manufacturing processes of a semiconductor device according to a variant of the embodiment of the invention (2 of 4).

Next, in the process shown in FIG. 30, the second metallic layer 27 is formed on the upper surface 26A of the portion of the first metallic layer 26 exposed on the opening 42A by the electroplating method using the first metallic layer 26 as a power feed layer. The second metallic layer 27 may be made of a Cu layer. In case a Cu layer is used as a second metallic layer 27, the thickness $T_5$ of the second metallic layer 27 may be 10 μm.

Figure 31:
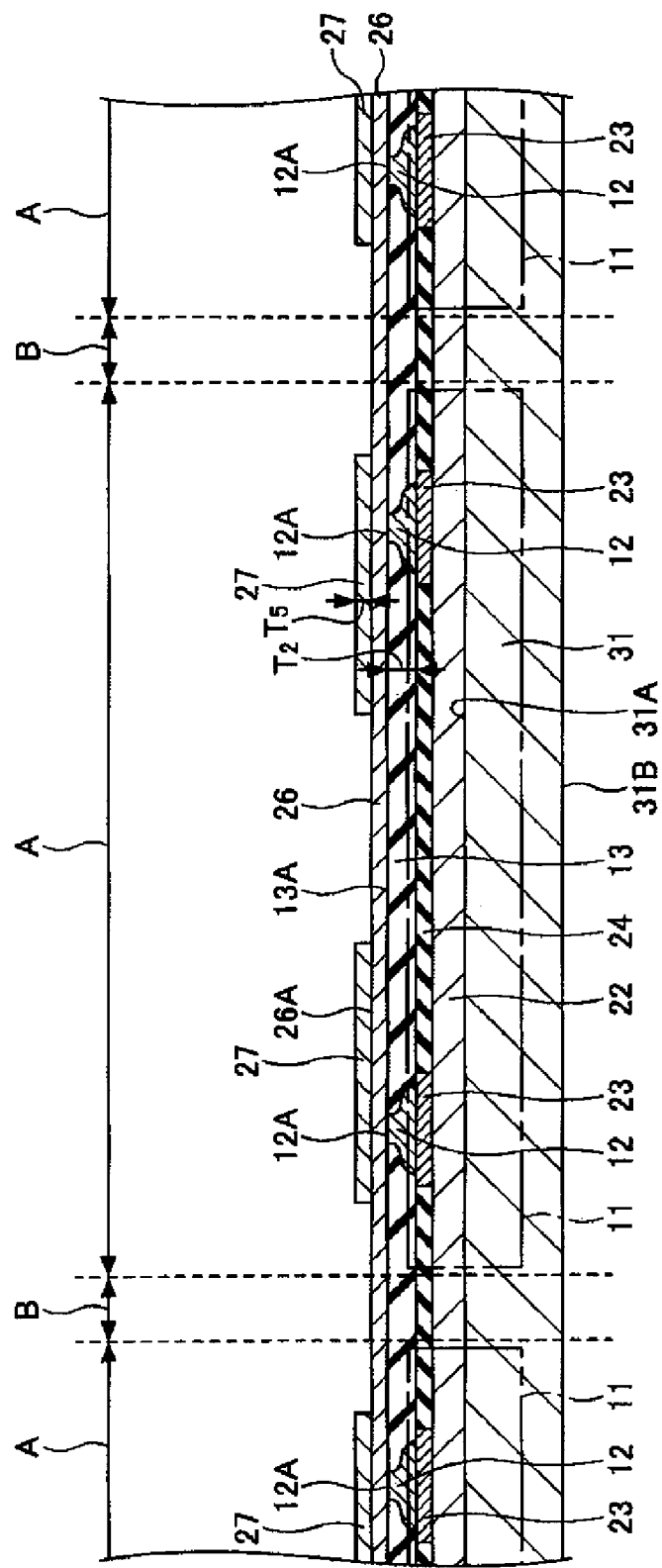
FIG. 31 shows the manufacturing processes of a semiconductor device according to a variant of the embodiment of the invention (3 of 4).
Figure 32:
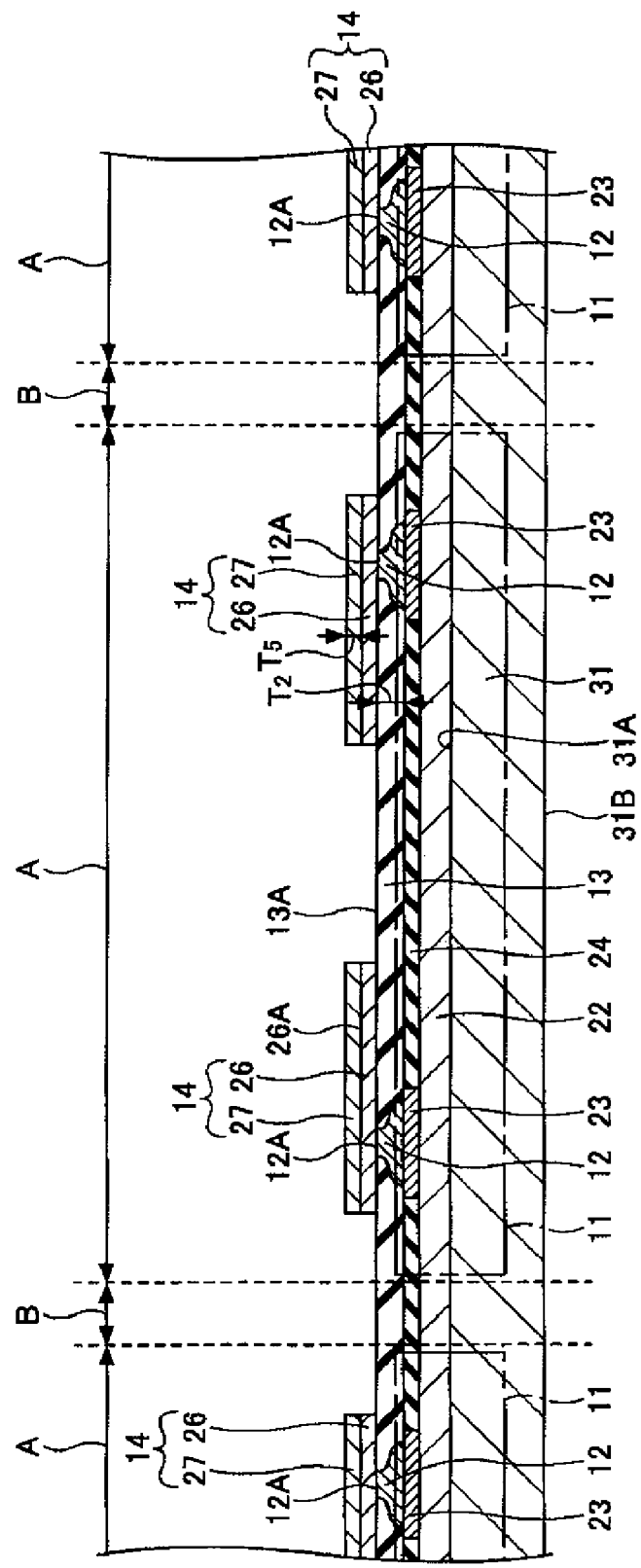
FIG. 32 shows the manufacturing processes of a semiconductor device according to a variant of the embodiment of the invention (4 of 4).

Next, in the process shown in FIG. 31, the resist film 42 shown in FIG. 30 is removed. Next, in the process shown in FIG. 32, the portion of the first metallic layer 26 not covered by the second metallic layer 27 (in other words, the portion of the first metallic layer 26 not corresponding to the forming region of the wiring pattern 14) is removed. To be more precise, the portion of the first metallic layer 26 not covered by the second metallic layer 27 is removed by way of etching (such as wet etching). This forms the wiring pattern 14 including the first metallic layer 26 and the second metallic layer 27. In other words, the wiring pattern 14 is formed by way of the semi-additive method.

By forming the wiring pattern 14 by way of the semi-additive method, it is possible to enhance the accuracy of the position of the wiring pattern 14 with respect to the internal connection terminal 12 as well as to support microfabrication of the wiring pattern 14.

Thereafter, the same processes as those shown in FIGS. 25 to 28 are made to form the semiconductor device 10 according to this embodiment.

With the method for manufacturing a semiconductor device according to a variant of this embodiment, it is possible to enhance the accuracy of the position of the wiring pattern 14 with respect to the internal connection terminal 12 as well as to support microfabrication of the wiring pattern 14 by forming the wiring pattern 14 by way of the semi-additive method.

The method for manufacturing a semiconductor device 10 according to a variant of this embodiment provides the same advantages as those of the method or manufacturing a semiconductor device 10 according to this embodiment explained by FIGS. 14 to 28

While preferred embodiments of the invention have been detailed so far, various changes and modifications can be made in it without departing from the spirit and scope thereof defined in the claims.

What is claimed is:

1. A semiconductor device comprising:
   a semiconductor substrate;
   an electrode pad;
   a semiconductor integrated circuit formed on the semiconductor substrate;

an internal connection terminal arranged on the electrode pad and having a flat upper surface;

an insulation layer formed on the surface of the semiconductor integrated circuit where the electrode pad is formed so as to expose the flat surface of the internal connection terminal;

a wiring pattern formed on an upper surface of the insulation layer and the upper surface of the internal connection terminal, the wiring pattern electrically connected to the internal connection terminal;

an external connection terminal arranged on a portion of an upper surface of the wiring pattern; and a solder resist for protecting the wiring pattern, wherein the solder resist is arranged to cover the upper surface of the wiring pattern which does not include the portion on which the external connection terminal is arranged and the solder resist is arranged to cover the side surface of the wiring pattern, and the area of the solder resist in plan view when the upper surface of the insulation layer is viewed from above is substantially the same as the area of the wiring pattern in plan view when the upper surface of the insulation layer is viewed from above.

2. The semiconductor device according to claim 1, wherein the solder resist completely covers the wiring pattern.

3. The semiconductor device according to claim 1, wherein the insulation layer includes a material that shields α rays.

4. The semiconductor device according to claim 1, wherein the insulation layer includes a material that shields visible rays and ultraviolet rays.

* * * * *